US009548348B2

(12) United States Patent
Sun et al.

(10) Patent No.: US 9,548,348 B2
(45) Date of Patent: Jan. 17, 2017

(54) METHODS OF FABRICATING AN F-RAM

(71) Applicant: Cypress Semiconductor Corporation, San Jose, CA (US)

(72) Inventors: Shan Sun, Monument, CO (US); Krishnaswamy Ramkumar, San Jose, CA (US); Thomas Davenport, Denver, CO (US); Kedar Patel, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 188 days.

(21) Appl. No.: 14/109,045

(22) Filed: Dec. 17, 2013

(65) Prior Publication Data

US 2015/0004718 A1  Jan. 1, 2015

Related U.S. Application Data

(60) Provisional application No. 61/839,997, filed on Jun. 27, 2013, provisional application No. 61/840,128, filed on Jun. 27, 2013, provisional application No. 61/841,104, filed on Jun. 28, 2013.

(51) Int. Cl.
*H01L 21/00* (2006.01)
*H01L 49/02* (2006.01)
*H01L 27/115* (2006.01)
*H01L 21/768* (2006.01)

(52) U.S. Cl.
CPC ......... *H01L 28/57* (2013.01); *H01L 21/76807* (2013.01); *H01L 21/76834* (2013.01); *H01L 21/76849* (2013.01); *H01L 21/76895* (2013.01); *H01L 27/11507* (2013.01)

(58) Field of Classification Search
CPC ..... H01L 27/0635; H01L 27/10805–27/10861; H01L 27/11502; H01L 2924/1441; H01L 27/11585
See application file for complete search history.

(56) References Cited

U.S. PATENT DOCUMENTS

| 5,498,569 A | 3/1996 | Eastep |
| 5,744,832 A * | 4/1998 | Wolters et al. ............... 257/295 |
| 5,985,713 A | 11/1999 | Bailey |

(Continued)

OTHER PUBLICATIONS

International Search Report and Written Opinion for Application # PCT/US14/040886, dated Nov. 4, 2014, 10 pages.

*Primary Examiner* — Cuong B Nguyen

(57) ABSTRACT

Non-volatile memory cells including complimentary metal-oxide-semiconductor transistors and embedded ferroelectric capacitor and methods of forming the same are described. In one embodiment, the method includes forming on a surface of a substrate a gate level including a gate stack of a MOS transistor, a first dielectric layer overlying the MOS transistor and a first contact extending through the first dielectric layer from a top surface thereof to a diffusion region of the MOS transistor. A local interconnect (LI) layer is deposited over the top surface of the first dielectric layer and the first contact, a ferro stack including a bottom electrode, a top electrode and ferroelectric layer there between deposited over the LI layer, and the ferro stack and the LI layer patterned to form a ferroelectric capacitor and a LI through which the bottom electrode is electrically coupled to the diffusion region of the MOS transistor.

14 Claims, 24 Drawing Sheets

(56) References Cited

U.S. PATENT DOCUMENTS

| | | | |
|---|---|---|---|
| 6,730,950 B1 | 5/2004 | Seshadri et al. | |
| 6,970,370 B2 | 11/2005 | Forbes | |
| 7,294,876 B2 | 11/2007 | Joo et al. | |
| 7,514,734 B2 | 4/2009 | Aggarwal et al. | |
| 8,247,855 B2 | 8/2012 | Summerfelt | |
| 8,518,792 B2 | 8/2013 | Sun et al. | |
| 8,552,484 B2 | 10/2013 | Nagai | |
| 8,552,515 B2 | 10/2013 | Sun et al. | |
| 2001/0013614 A1* | 8/2001 | Joshi et al. | 257/295 |
| 2002/0036307 A1* | 3/2002 | Song | 257/296 |
| 2004/0159874 A1* | 8/2004 | Tsuchiya | H01L 27/11502 |
| | | | 257/306 |
| 2005/0239218 A1 | 10/2005 | Aggarwal et al. | |
| 2008/0081380 A1 | 4/2008 | Celii et al. | |
| 2008/0224195 A1* | 9/2008 | Wang et al. | 257/295 |
| 2008/0303074 A1* | 12/2008 | Noda | H01L 21/76895 |
| | | | 257/295 |
| 2009/0026514 A1* | 1/2009 | Wang | H01L 27/11507 |
| | | | 257/295 |
| 2009/0057736 A1 | 3/2009 | Udayakumar et al. | |
| 2010/0163944 A1 | 7/2010 | Kanaya | |
| 2010/0224961 A1 | 9/2010 | Summerfelt et al. | |
| 2010/0295149 A1 | 11/2010 | Summerfelt et al. | |
| 2011/0001141 A1 | 1/2011 | Tanabe | |
| 2011/0062550 A1 | 3/2011 | Udayakumar et al. | |
| 2011/0079878 A1 | 4/2011 | Aggarwal et al. | |
| 2011/0169135 A1* | 7/2011 | Nakao | 257/532 |
| 2013/0300003 A1 | 11/2013 | Sun et al. | |

\* cited by examiner

METHODS OF FABRICATING AN F-RAM

CROSS-REFERENCE TO RELATED APPLICATIONS

This application claims the benefit of priority under 35 U.S.C. 119(e) to U.S. Provisional Patent Application Ser. No. 61/839,997, filed Jun. 27, 2013, to U.S. Provisional Patent Application Ser. No. 61/840,128, filed Jun. 27, 2013, and to U.S. Provisional Patent Application Ser. No. 61/841,104, filed Jun. 28, 2013, all of which are incorporated by reference herein.

TECHNICAL FIELD

The present disclosure relates generally to semiconductor devices, and more particularly to ferroelectric random access memories (F-RAM) including embedded or integrally formed ferroelectric capacitors and complementary metal-oxide-semiconductor (CMOS) transistors and methods for fabricating the same.

BACKGROUND

Ferroelectric random-access memories (F-RAM) typically include a grid or an array of storage elements or cells, each including at least one ferroelectric capacitor and one or more associated transistors to select the cell and control reading or writing thereto. When an external electric field is applied across a ferroelectric material of a ferroelectric capacitor in the cell, dipoles in the material align with the field direction. After the electric field is removed, the dipoles retain their polarization state. Data is stored in the cells as one of two possible electric polarizations in each data storage cell. For example, in a one transistor-one capacitor (1T1C) cell, a "1" may be encoded using a negative remnant polarization, and a "0" is encoded using a positive remnant polarization.

The ferroelectric capacitor in an F-RAM cell typically includes a ferroelectric material, such as lead zirconate titanate (PZT) between an upper electrode and a lower electrode. The transistors in the cells are typically metal-oxide-semiconductor (MOS) transistors fabricated using a standard or baseline complimentary-metal-oxide-semiconductor (CMOS) process flows, involving the formation and patterning of conducting, semiconducting, dielectric and materials. The composition of these materials, as well as the composition and concentration of processing reagents, and temperature used in such a CMOS process flow are stringently controlled for each operation to ensure the resultant MOS transistors will function properly. Materials and processes typically used to fabricate the ferroelectric capacitor differ significantly from those of the baseline CMOS process flow, and can detrimentally impact the MOS transistors.

Thus, in conventional methods of fabricating F-RAM the ferroelectric capacitor is fabricated in a separate layer overlying or the layer in which the MOS transistors are fabricated and isolated therefrom by one or more layers. It will be understood by those skilled in the art that conventional methods of fabricating F-RAM require several extra mask and processing steps, all of which increase fabrication time, costs, and defect density lowering a yield of working memories.

SUMMARY

Non-volatile memory cells including complimentary metal-oxide-semiconductor (CMOS) transistors and embedded ferroelectric capacitors formed according to methods of the present disclosure minimizes changes to the CMOS process flow, reducing cost of fabricating ferroelectric random access memories (F-RAM), lowering defect density and enabling tighter design rules.

In one embodiment, the method includes forming over a first dielectric layer, a ferroelectric capacitor including a bottom electrode electrically coupled to a diffusion region of a MOS transistor through a first contact, a top electrode and ferroelectric layer there between. A second dielectric layer is formed overlying the ferroelectric capacitor and a second contact extending through the second dielectric layer from a top surface thereof to the top electrode of the ferroelectric capacitor. A local interconnect (LI) layer is deposited over the top surface of the second dielectric layer and electrically coupled to the second contact.

In another embodiment, the method includes forming on a surface of a substrate a gate level including a gate stack of a MOS transistor, a first dielectric layer overlying the MOS transistor and a first contact extending through the first dielectric layer from a top surface thereof to a diffusion region of the MOS transistor. A local interconnect (LI) layer is deposited over the top surface of the first dielectric layer and the first contact, a ferro stack including a bottom electrode, a top electrode and ferroelectric layer there between deposited over the LI layer, and the ferro stack and the LI layer patterned to form a ferroelectric capacitor and a LI through which the bottom electrode is electrically coupled to the diffusion region of the MOS transistor.

In yet another embodiment, the LI and the LI contact are formed using a dual-damascene process, lowering a total height of the ferro stack and resulting ferroelectric capacitor.

BRIEF DESCRIPTION OF THE DRAWINGS

The present invention will be understood more fully from the detailed description that follows and from the accompanying drawings and the appended claims provided below, where:

DETAILED DESCRIPTION

Embodiments of ferroelectric random access memories (F-RAM) including embedded or integrally formed ferroelectric capacitors and complementary metal-oxide-semiconductor (CMOS) transistors and methods of fabricating the same are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
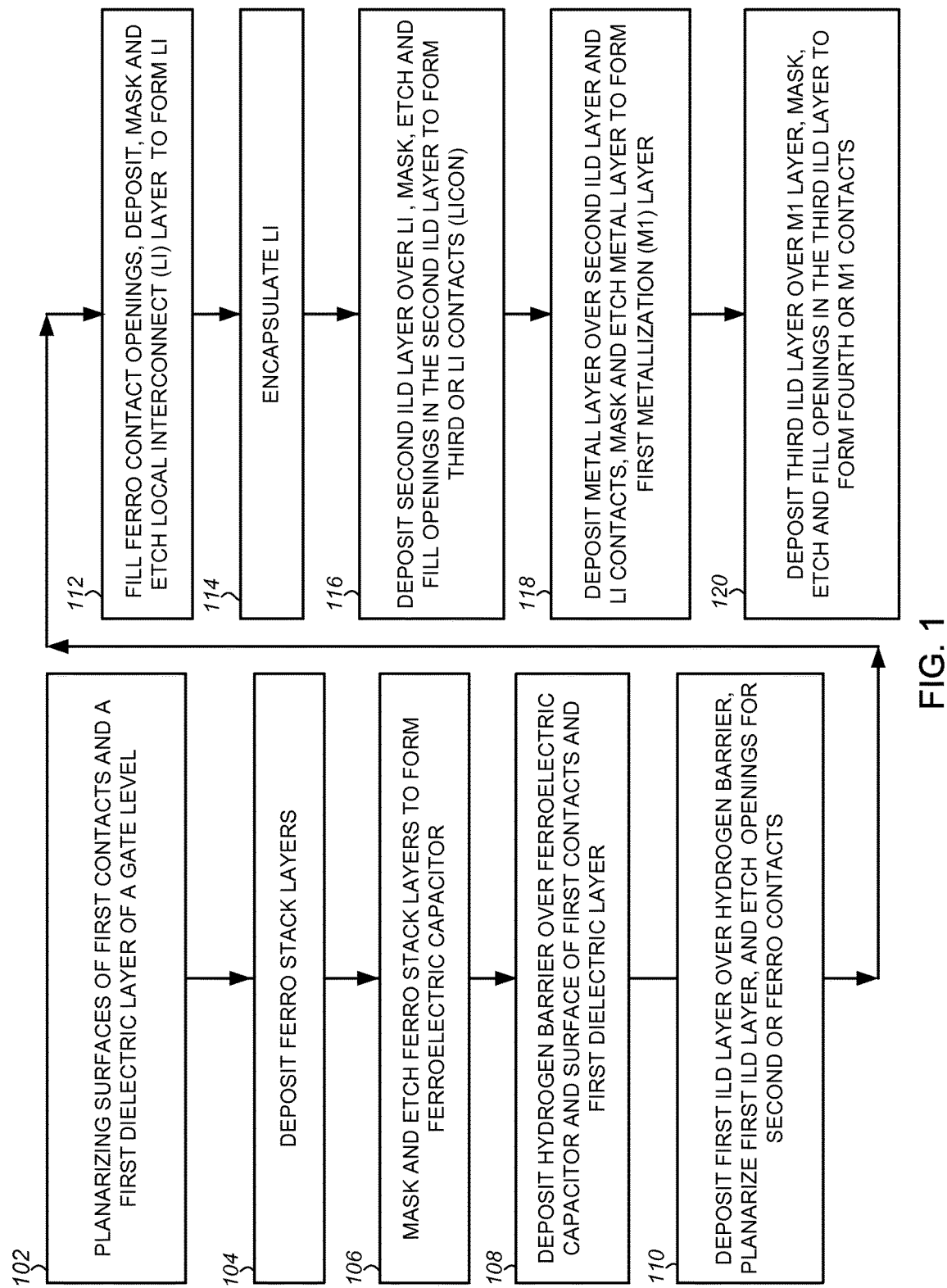
FIG. 1 is a flowchart illustrating an embodiment of a method for fabricating a ferroelectric random access memory (F-RAM) including an embedded ferroelectric capacitor and metal-oxide-semiconductor (MOS) transistor.

An embodiment of a method for integrating or embedding a ferroelectric capacitor into a standard or baseline CMOS process flow for fabricating an F-RAM will now be described in detail with reference to FIG. 1 and FIGS. 2A through 2J. FIG. 1 is a flowchart illustrating an embodiment of a method for fabricating a ferroelectric random access memory (F-RAM) including an embedded ferroelectric capacitor and metal-oxide-semiconductor (MOS) transistor. FIGS. 2A-2I are block diagrams illustrating cross-sectional views of a portion of an F-RAM cell during fabrication thereof according to the method of FIG. 1. FIG. 2J is a block diagrams illustrating a cross-sectional views of a portion of a completed F-RAM cell fabricated according to the method of FIG. 1

Figure 2A:
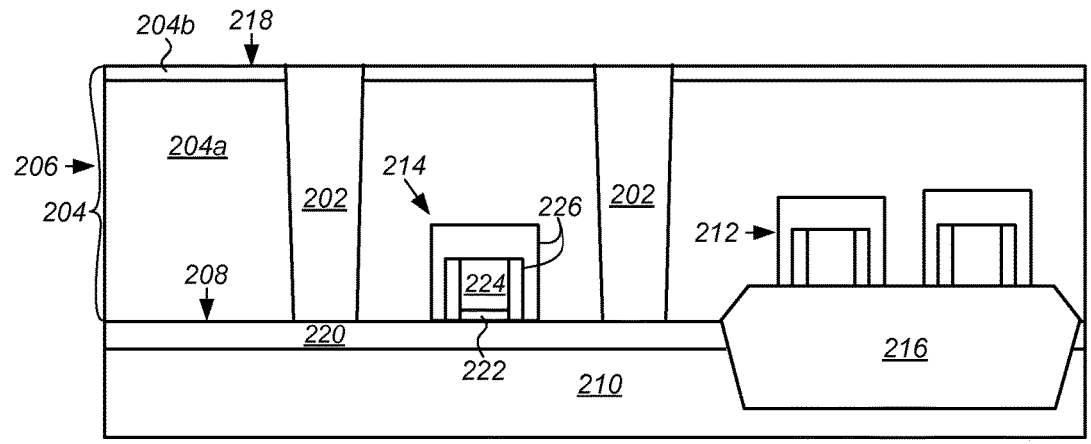
FIGS. 2A-2I are block diagrams illustrating cross-sectional views of a portion of an F-RAM cell during fabrication thereof according to the method of FIG. 1.

Referring to FIG. 1 and FIG. 2A, the process begins with planarizing surfaces of first contact plugs or contacts 202 and an inter-metal dielectric or first dielectric layer 204 after formation of a gate level 206 on a surface 208 of a substrate 210, the gate level including gate stacks 212 of one or more metal-oxide-semiconductor (MOS) transistors 214, separated by one or more isolation structures 216 the first dielectric layer overlying the MOS transistors and the first contacts extending through the first dielectric layer from a top surface 218 thereof to a diffusion region 220, such as a source or a drain, in the MOS transistor in the substrate (block 102).

In addition to a source and a drain, diffusion regions 220 can include a channel region (not shown in this figure). Generally, the substrate 210 and, hence, diffusion regions 220, may be composed of any material suitable for semiconductor device fabrication. In one embodiment, the substrate 210 is a bulk substrate composed of a single crystal of a material which may include, but is not limited to, silicon, germanium, silicon-germanium or an III-V compound semiconductor material. In another embodiment, the substrate 210 includes a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. The top epitaxial layer is composed of a single crystal layer which may include, but is not limited to, silicon (i.e. to form a silicon-on-insulator (SOI) semiconductor substrate), germanium, silicon-germanium and an III-V compound semiconductor material. The insulator layer is composed of a material which may include, but is not limited to, silicon dioxide, silicon nitride and silicon oxy-nitride. The lower bulk layer is composed of a single crystal which may include, but is not limited to, silicon, germanium, silicon-germanium, an III-V compound semiconductor material and quartz.

The substrate 210 and, hence, the channel region, may include dopant impurity atoms. In a specific embodiment, channel region is doped P-type and, in an alternative embodiment, channel region is doped N-type. Source and drain diffusion regions 220 in the substrate 210 have opposite conductivity to channel region. For example, in one embodiment the substrate 210 and, hence, channel region, is composed of boron-doped single-crystal silicon having a boron concentration in the range of $1\times10^{15}$–$1\times10^{19}$ atoms/$cm^3$. Source and drain diffusion regions 220 are composed of phosphorous- or arsenic-doped regions having a concentration of N-type dopants in the range of $5\times10^{16}$–$5\times10^{19}$ atoms/$cm^3$. Generally, source and drain diffusion regions 220 have a depth in the substrate 210 in the range of 80-200 nanometers (nm). In accordance with an alternative embodiment of the present disclosure, source and drain diffusion regions 220 are P-type doped regions while the substrate 210 and channel region is an N-type doped region.

The gate stacks 212 can include a gate oxide 222 formed on the surface 208 of the substrate 210, a gate layer 224 formed on gate oxide, and one or more sidewall spacers 226 isolating the gate layer from the first dielectric layer 204. Additionally, although not shown in this figure it will be understood by those skilled in the art that the gate layer 224 is generally electrically coupled to an overlying local interconnect (LI) or a metallization layer, such as a first metallization (M1) layer described in more detail below.

The first dielectric layer 204 can include a single layer of dielectric material or multiple layers of dielectric material as in the embodiment shown. For example, in one embodiment the first dielectric layer 204 includes a lower or bottom first dielectric layer 204a including phosphosilicate glass (PSG) formed or deposited by a chemical vapor deposition (CVD) process, such as plasma, low pressure or atmospheric CVD, and an upper or top first dielectric layer 204b including a silicon oxide, deposited by low pressure CVD (LPCVD) tool using tetraethyl-orthosilicate (TEOS) based process gas or precursors.

The first contacts 202 are formed by performing a contact etch to etch the first dielectric layer 204 exposing the underlying diffusion regions 220 followed by filling the openings formed with a conductive material, typically a refractory metal. The contact etch can be accomplished using standard photolithographic techniques and any suitable wet or dry etching chemistry for etching a silicon oxide and/or PSG. Suitable contact etch chemistries can include, for example, wet etching using hydrofluoric acid (HF), or gas phase etching (GPE) using a reactive ion etch (RIE) process gas including HF and methanol or methyl alcohol ($CH_3OH$). Contact openings formed in the first dielectric layer 204 are filled with a refractory metal. By refractory metals it is meant metals of elements of the groups 4, 5 and 6 of the periodic table, including titanium (Ti), tantalum (Ta), tungsten (W), and nitrides or alloys thereof, which are resistant to high temperatures. The refractory metal can be deposited, for example, by physical vapor deposition, such as sputtering or evaporation, or by CVD and electroless plating.

As indicated in step or block 102 of FIG. 1, once formed the surfaces of the first contacts 202 and first dielectric layer 204 are planarized, for example, using a chemical mechanical polishing (CMP) process.

Figure 2B:
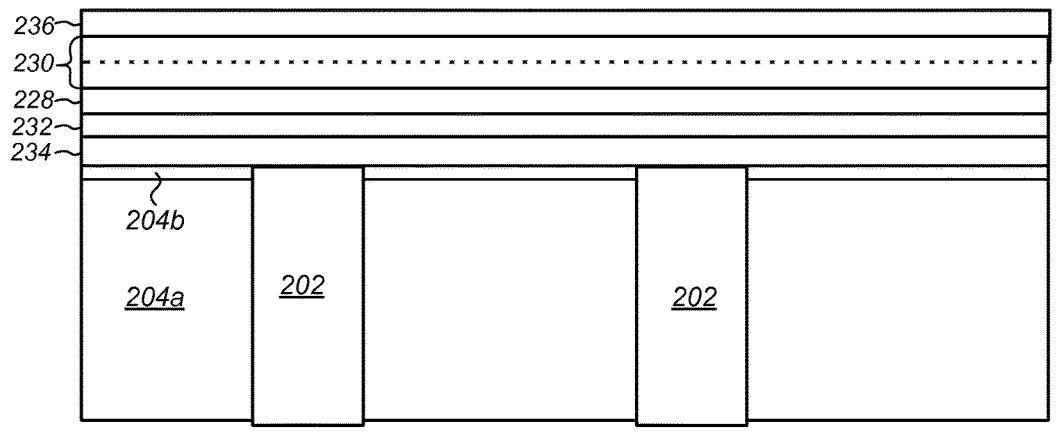

Next, referring to FIG. 1 and FIG. 2B layers of a ferro stack from which a ferroelectric capacitor will be formed are deposited or formed over the planarized surfaces of the first contacts 202 and first dielectric layer 204 (block 104). Generally, the ferro stack layers includes a layer of a ferroelectric material, such as a lead zirconate titanate (PZT) ferroelectric layer 228, between a top electrode 230 and bottom electrode 232 in electrical contact with or electrically coupled to one of the underlying first contacts 202. In some embodiment, such as that shown, the ferro stack can further include an oxygen ($O_2$) barrier 234. The $O_2$ barrier 234 can include a layer of titanium aluminum nitride (TiAlN) or aluminum titanium nitride (AlTiN) having a thickness of from about 0.03 to about 0.10 µm, and is deposited or formed using any suitable deposition method, such as CVD, atomic layer deposition (ALD), or physical vapor deposition (PVD). The top and the bottom electrodes 230, 232, can include one or more layers of iridium or iridium oxide having a thickness of from about 0.05 to about 0.20 µm, and deposited or formed using CVD, ALD or PVD. In the embodiment shown the top electrode 230 is a multi-layer top electrode including, for example, a lower layer of iridium oxide (IrO2) in contact with the PZT ferroelectric layer 228 and an upper layer of iridium (Ir) overlying the lower layer of the top electrode. The PZT ferroelectric layer 228 is deposited on the bottom electrode 232 to a thickness of from about 0.04 to about 0.10 µm, using CVD, ALD or PVD.

Figure 2C:
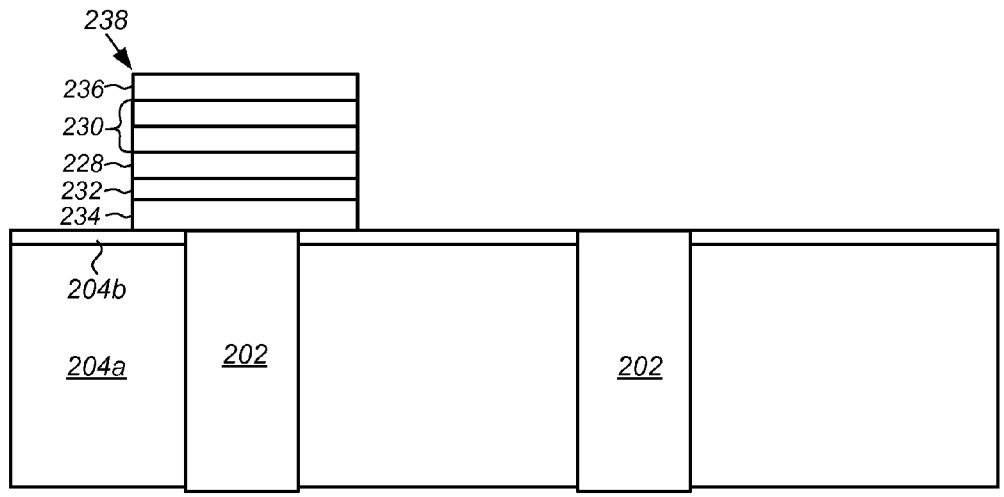

Referring to FIG. 1 and FIG. 2C a hard mask 236 is formed over the ferro stack layers and the ferro stack layers patterned using a patterned hardmask and standard etching technologies to form a ferroelectric capacitor 238 (block 106). In certain embodiments, the hard mask 236 can include multiple layers and the material of the hard mask is selected to form a hydrogen ($H_2$) barrier, and is left on the ferro stack layers after forming the ferroelectric capacitor 238. The hard mask 236 can include, for example, a layer of titanium aluminum nitride (TiAlN) having a thickness of from about 0.15 to about 0.20 µm, and deposited or formed using a PVD process. Suitable chemistries and techniques for etching the ferro stack layers can include standard metal etch chemistries.

Figure 2D:
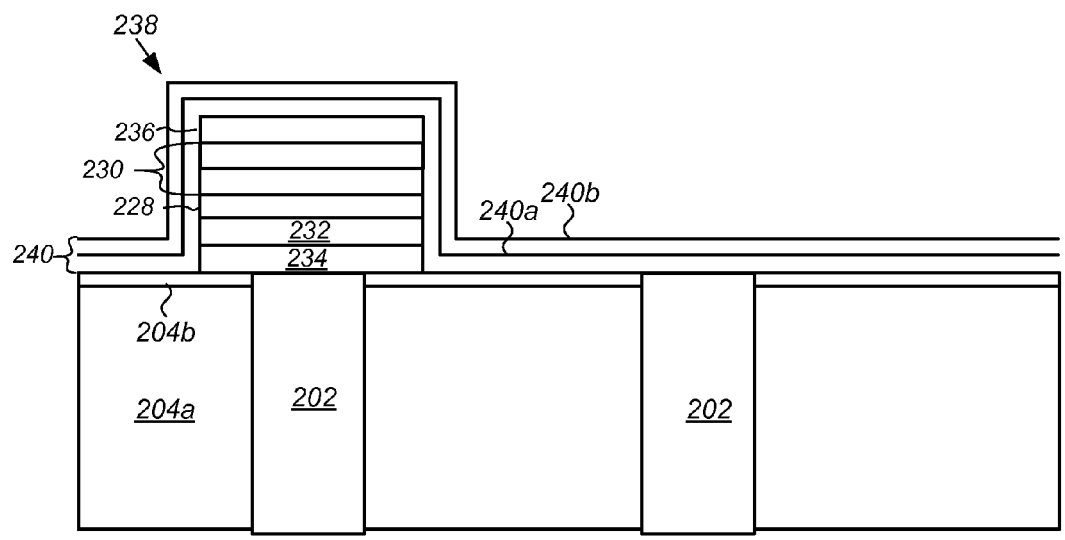

Next, referring to FIG. 1 and FIG. 2D further layers of an $H_2$ barrier 240 is deposited over the top and sidewalls of the ferroelectric capacitor 238 and over the surface 218 of first dielectric layer 204 and any exposed first contact 202, substantially encapsulating the ferroelectric capacitor (block 108). It has been observed that when the ferroelectric capacitor 238 is exposed to hydrogen introduced, for example during subsequent processing the properties of the ferroelectric capacitor can be severely degraded. The $H_2$ barrier 240 can include a single material layer, or multiple material layers. In one embodiment, such as that shown, the $H_2$ barrier 240 can include a lower or first hydrogen encapsulation layer 240a of aluminum oxide ($Al_2O_3$) having a thickness of from about 100 to about 300 Å, and deposited by ALD, and an upper or second hydrogen encapsulation layer 240b of silicon nitride (SiN) having a thickness of from about 0.02 to about 0.10 µm, and deposited by CVD or ALD.

Figure 2E:
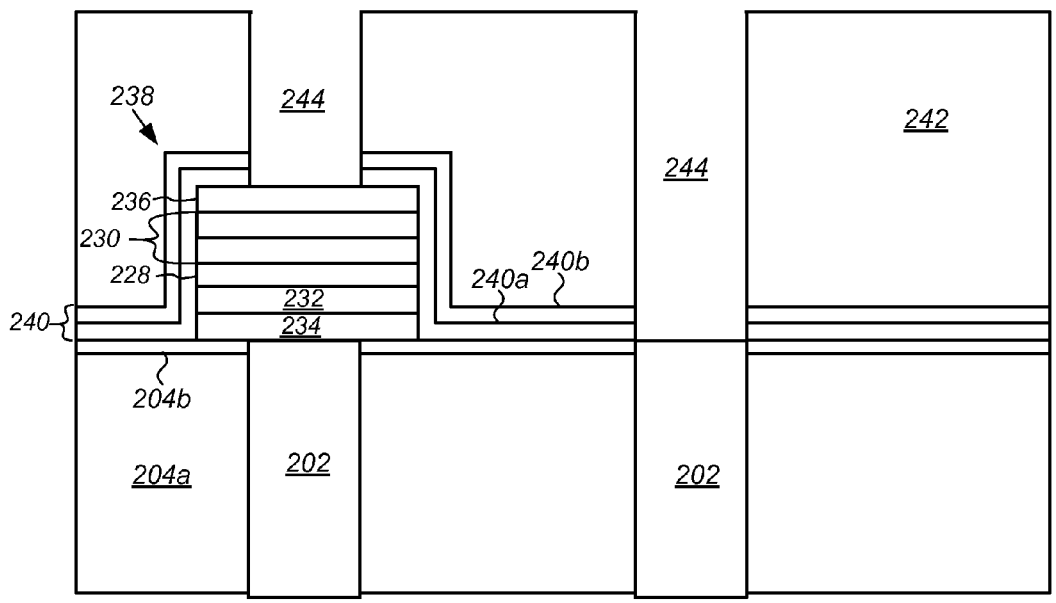

Referring to FIG. 1 and FIG. 2E, a first inter-level dielectric (ILD) layer 242 is deposited or formed over the $H_2$ barrier 240, the ILD layer is planarized and openings 244 for second or ferro contacts etched through the ILD layer and $H_2$ barrier to the hard mask 236 to electrically couple to the top electrode 230 of the ferroelectric capacitor 238, and to any exposed first contact 202 (block 110). The ILD layer 242 can include one or more layers of an undoped oxide, such as silicon-dioxide ($SiO_2$), a nitride, such as silicon nitride ($Si_xN_y$), a silicon-oxynitride ($Si_xO_yN_z$) or, as with the intermetal or first dielectric layer 204 described above an oxide, such as phosphosilicate glass (PSG). For example, in one embodiment the ILD layer 242 can include a $SiO_2$ having a thickness of from about 0.60 to about 0.80 µm, by deposited by LPCVD using TEOS.

As indicated in step or block 110 of FIG. 1, once formed the surface of the ILD layer 242 is planarized using, for example, a CMP process, and openings 244 for second or ferro contacts etched through the ILD layer and $H_2$ barrier 240 using standard photolithographic and contact etching techniques. For an $SiO_2$ ILD layer 242 suitable contact etching techniques can include forming a patterned photoresist layer, and etching the ILD layer with an etch chemistry comprising carbon-monoxide (CO), argon (Ar), octafluorocyclobutane ($C_4F_8$) or Freon® 318, and, optionally, nitrogen ($N_2$).

Figure 2F:
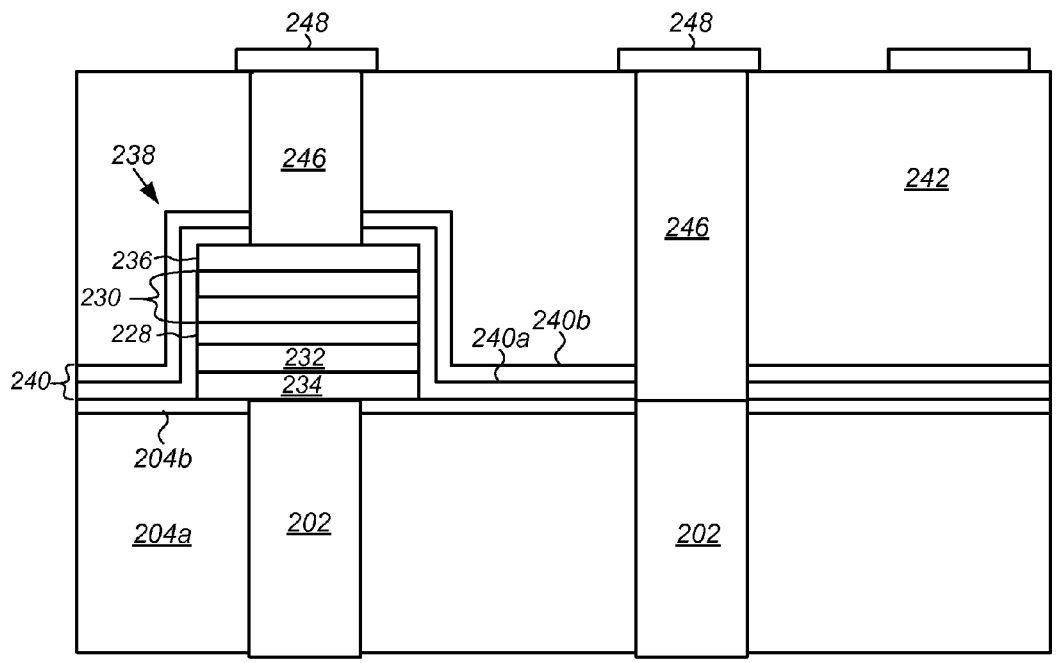

Next, referring to FIG. 1 and FIG. 2F ferro contact openings 244 are filled to form second or ferro contacts 246, and a local interconnect (LI) layer deposited, masked and etched to form a LI 248 over the ferro contacts and the surface of the ILD layer 242 (block 112). As with the first contacts 202 described above, the ferro contacts 246 are formed by filling the contact openings with a refractory metal, such as titanium (Ti), tantalum (Ta), tungsten (W), and nitrides or alloys thereof, by physical vapor deposition, such as sputtering, evaporation or CVD. After filling the first contact openings the contacts are planarized using, for example, a CMP process. The LI 248 is formed by depositing a LI layer (not shown in this figure) including one or more layers of titanium (Ti) or titanium nitride (TiN) having a thickness of from about 850 to about 1150 Å formed over the ferro contacts and the ILD layer 242 using CVD, ALD or PVD, and patterning the LI layer using standard photolithographic and etching techniques. For example, a Ti/TiN LI layer can be dry etched using a mixture of a fluorine based gas, such as sulfur hexafluoride ($SF_6$), nitrogen trifluoride ($NF_3$) or tetrafluoromethane ($CF_4$), a chlorine based gas, such as chlorine ($Cl_2$) or Boron Trichloride ($BCl_3$), and, optionally, an argon gas to increase the etch rate by sputtering.

Figure 2G:
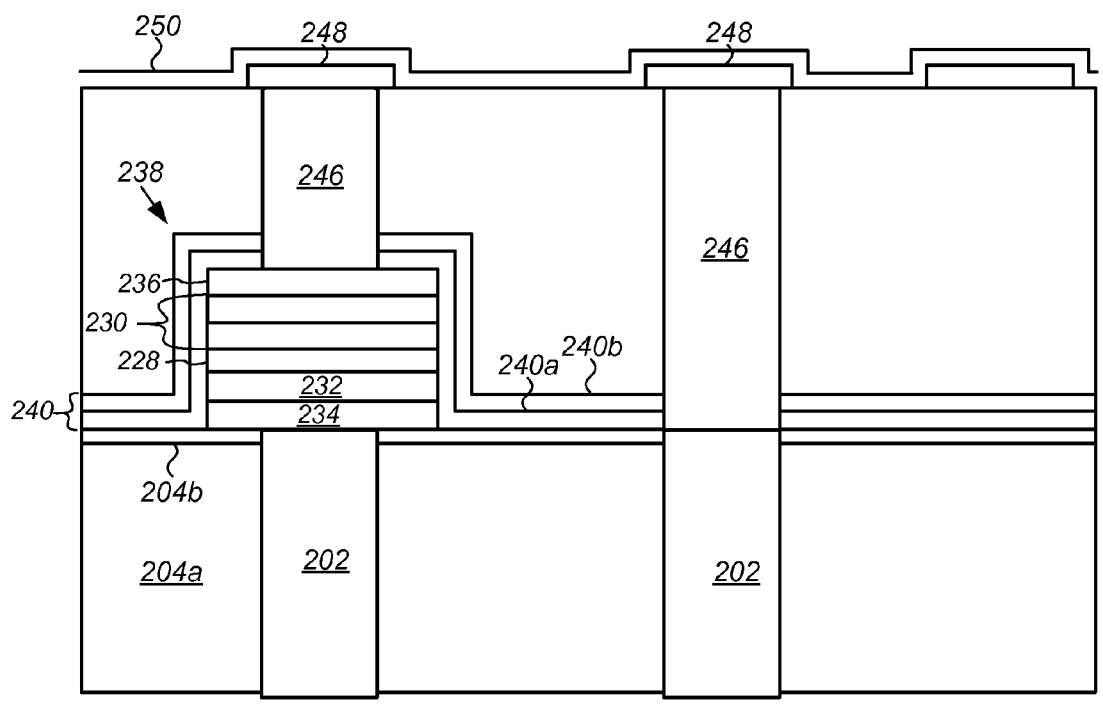

Referring to FIG. 1 and FIG. 2G, the LI 248 is covered or encapsulated by local interconnect nitride layer (LINIT 250) to isolate and protect the LI in subsequent processing steps (block 114). The LINIT 250 can include a layer of silicon nitride (SiN) deposited by CVD or ALD to a thickness of about 850 Å.

Figure 2H:
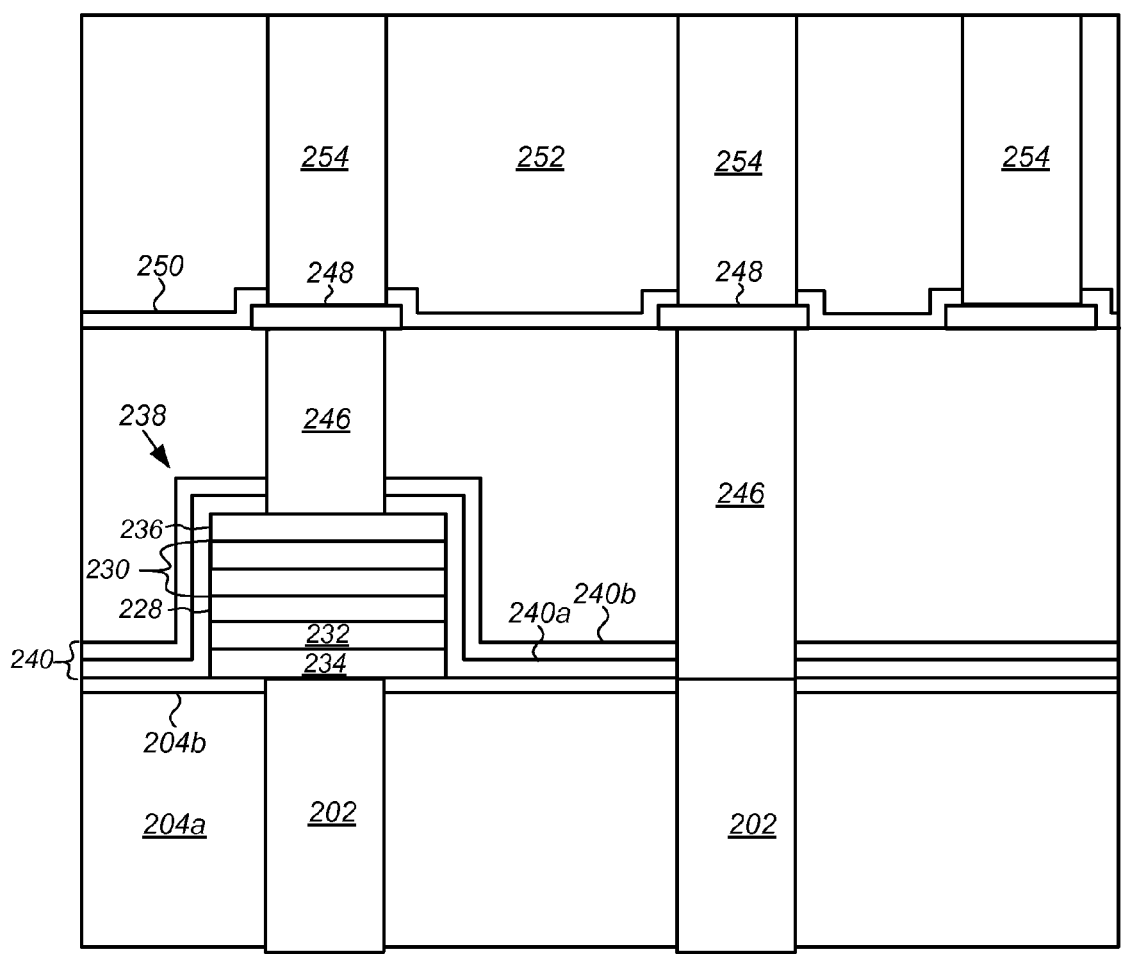

Next, referring to FIG. 1 and FIG. 2H a second ILD layer 252 is deposited or formed over the LINIT 250, planarized and openings for third or LI contacts (LICON 254) etched through the second ILD layer and the LINIT to the LI 248 to electrically couple to the top electrode 230 of the ferroelectric capacitor 238, and to any exposed ferro contacts 246 (block 116). As with the first ILD layer 242 described above the second ILD layer 252 can include one or more layers of $SiO_2$, a silicon nitride, a silicon-oxynitride, or PSG, deposited to a thickness of from about 0.35 to about 0.38 µm by CVD or LPCVD. As with the first contacts 202 and the ferro contacts 246 described above, the local interconnect contacts or LICON 254 are formed by filling the contact openings with titanium (Ti), tantalum (Ta), tungsten (W), and nitrides or alloys thereof, by sputtering, evaporation, CVD or electroless plating. After filling the contact openings the contacts are planarized using, for example, a CMP process.

Figure 2I:
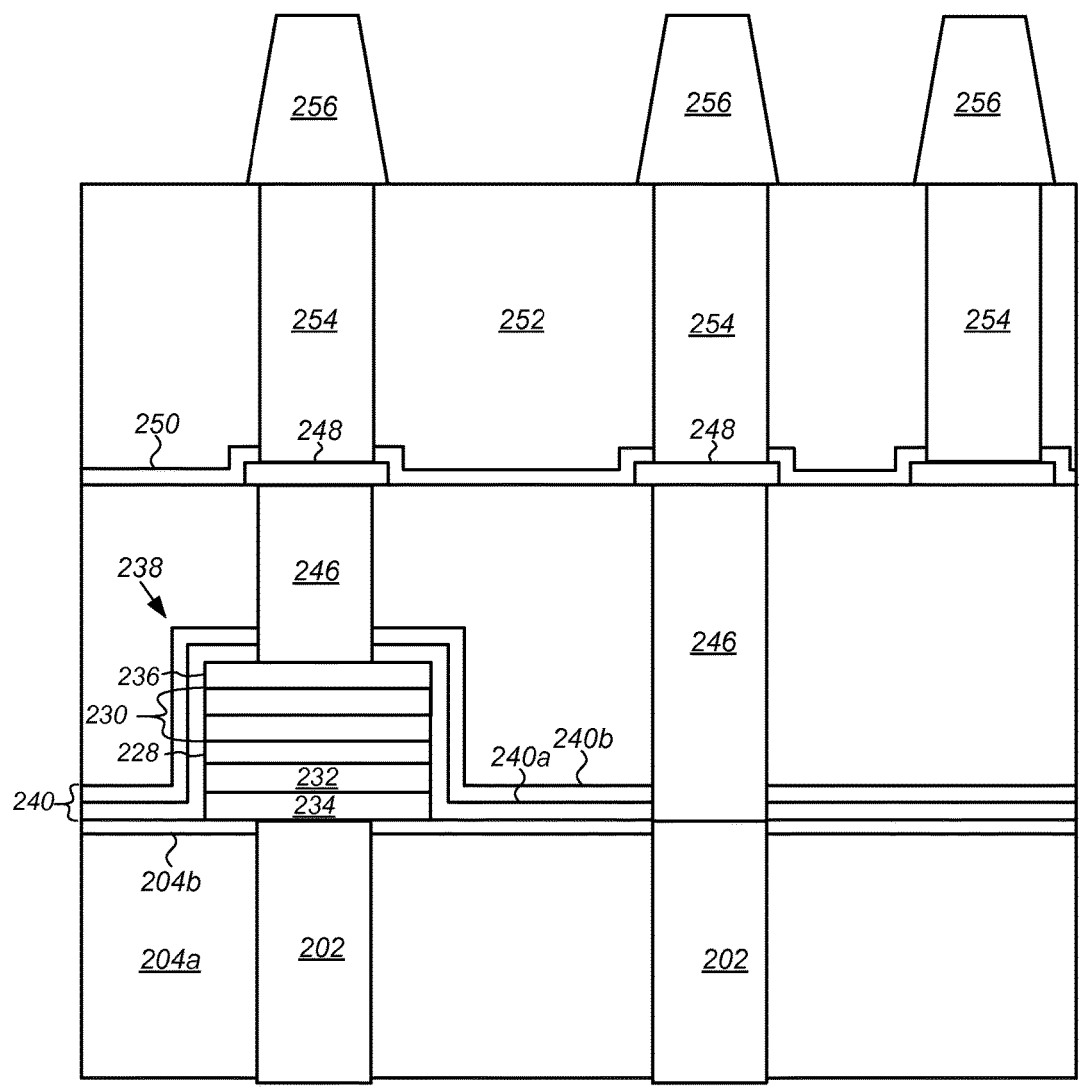
Figure 2J:
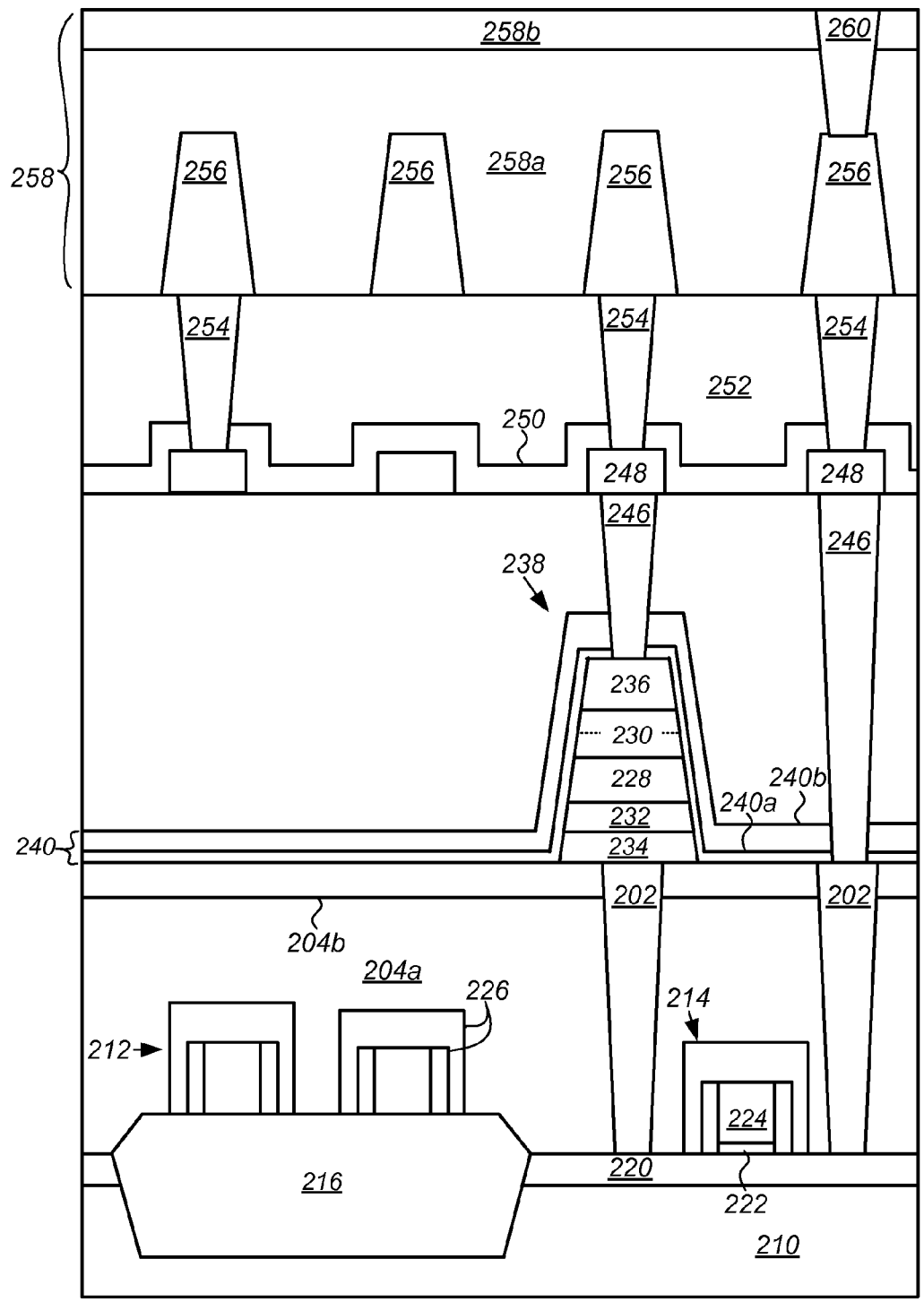
FIG. 2J is a block diagram illustrating a cross-sectional views of a portion of an F-RAM cell fabricated according to the method of FIG. 1.

Referring to FIG. 1 and FIG. 2I, a metal layer is deposited over the second ILD layer 252 and LICON 254, masked and etched to form a first metallization (M1) layer 256 (block 118). Generally, the metal layer is includes aluminum, copper or alloys or mixtures thereof, and is deposited by PVD, such as sputtering, evaporation, or electroless plating to a thickness of from about 1000 to about 5000 Å. The metal layer is patterned to form the M1 layer 256 using standard photolithographic and metal etching techniques, including for example, high density plasma (HDP) etching, and various post-metal etch cleaning processes to prevent corrosion defects.

Next, a third ILD layer 258 is deposited over M1 layer 256, masked, etched and openings formed in the third ILD layer filled to form fourth or M1 layer contacts 260 in a substantially complete F-RAM cell (block 120). FIG. 2J is a block diagram illustrating a cross-sectional view of a portion of a complete F-RAM cell fabricated according to the method of FIG. 1. As with the first and second ILD layers 242, 252, described above the third ILD layer 258 can include one or more layers of $SiO_2$, silicon nitride, silicon-oxynitride, or PSG, deposited to a thickness of from about 0.50 to about 0.78 µm by CVD or LPCVD. The contact openings are formed using a standard contact or oxide etch, and the fourth or M1 layer contacts 260 are formed by filling the contact openings with titanium (Ti), tantalum (Ta), tungsten (W), and nitrides or alloys thereof, by sputtering, evaporation, CVD or electroless plating. After filling the contact openings the contacts are planarized using, for example, a CMP process.

It will be understood by those skilled in the art that the embodiment of a method of manufacturing or fabricating an F-RAM cell including embedded or integrally formed ferroelectric capacitor and CMOS transistors described above advantageously minimizes changes to the standard complimentary metal-oxide-semiconductor (CMOS) process flow, including the addition of just two additional mask steps, thereby reducing cost of fabricating ferroelectric random access memories (F-RAM).

Another embodiment of a method for fabricating an F-RAM including an embedded ferroelectric capacitor and MOS transistor, in which a portion of a local interconnect forms a bottom electrode of the ferroelectric capacitor will now be described in detail with reference to FIGS. 3 and 4A through 4I.

Figure 3:
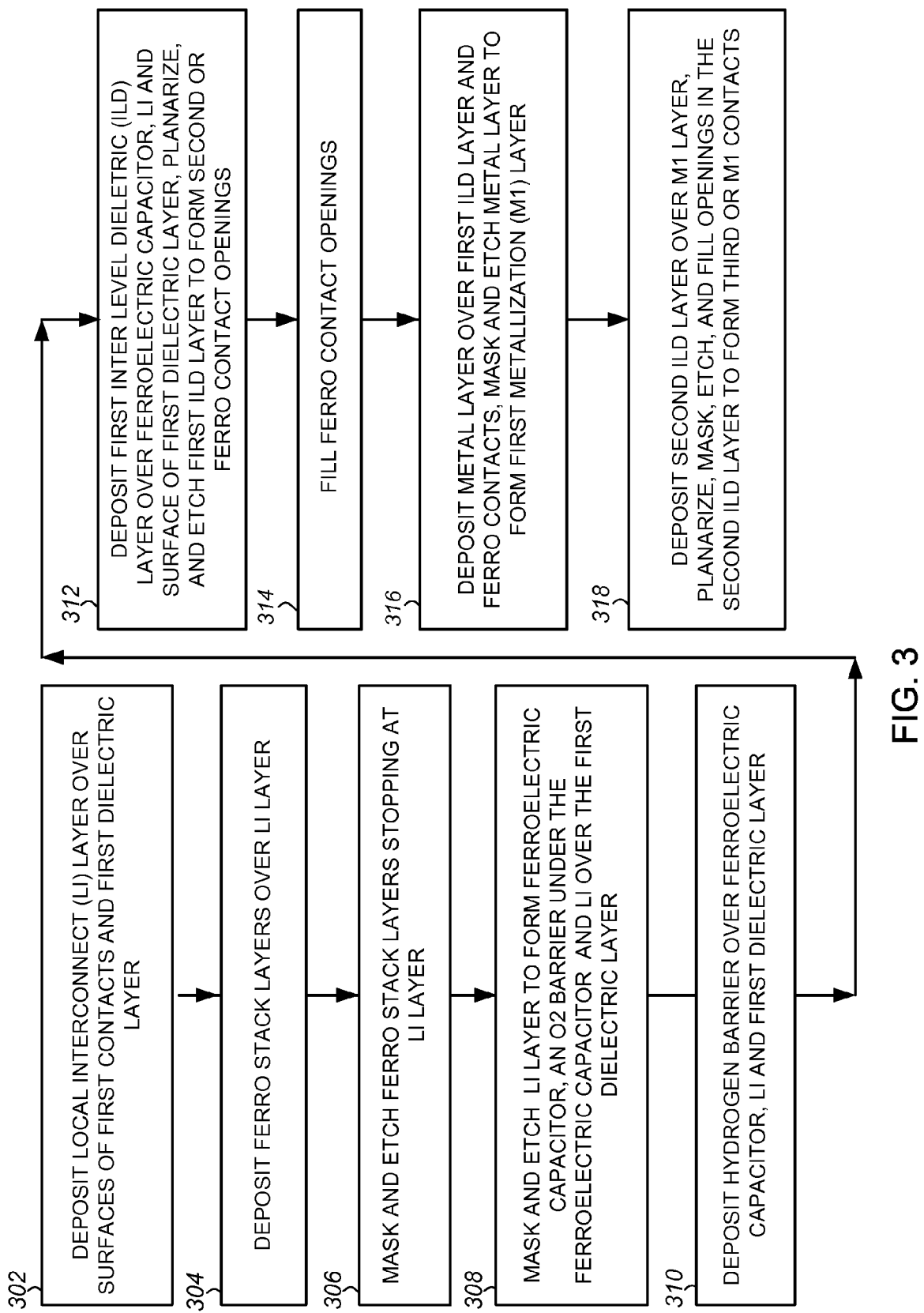
FIG. 3 is a flowchart illustrating another embodiment of a method for fabricating an F-RAM including an embedded ferroelectric capacitor and MOS transistor, in which a portion of a local interconnect forms a bottom electrode of the ferroelectric capacitor.
Figure 4A:
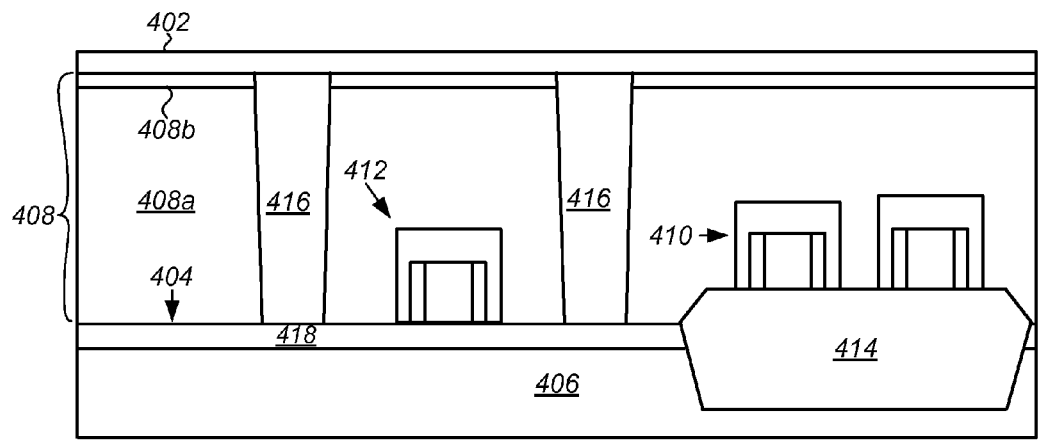
FIGS. 4A-4H are block diagrams illustrating cross-sectional views of a portion of an F-RAM during fabrication thereof according to the method of FIG. 3.

Referring to FIG. 3 and FIG. 4A, the process begins with depositing a local interconnect (LI) layer 402 over a planarized surface of a gate level formed on a surface 404 of a substrate 406 (block 302). As with the embodiment of FIG. 4A, the gate level includes an inter-metal dielectric or first dielectric layer 408 with gate stacks 410 of one or more metal-oxide-semiconductor (MOS) transistors 412 separated by one or more isolation structures 414, and one or more first contact plugs or contacts 416 extending therethrough to diffusion regions 418, such as a source or a drain, of the MOS transistor.

The first dielectric layer 408 can include a single layer of dielectric material or multiple layers of dielectric material as in the embodiment shown. For example, in one embodiment the first dielectric layer 408 includes a lower or bottom first dielectric layer 408a including PSG formed or deposited by a CVD process, and an upper or top first dielectric layer 408b including a silicon oxide, deposited by an LPCVD tool using a TEOS based process gas or precursor.

The LI layer 402 can include one or more layers of titanium (Ti) or titanium nitride (TiN) having a thickness of from about 800 to about 1200 Å formed over the first contacts 416 and the first dielectric layer 408 using CVD, ALD or PVD.

Figure 4B:
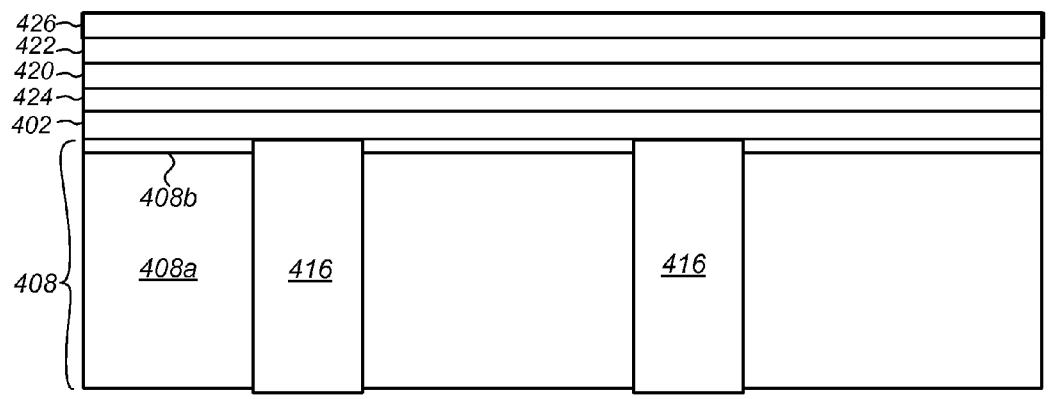

Next, referring to FIG. 3 and FIG. 4B ferro stack layers are deposited or formed over the LI layer 402 (block 304). The ferro stack layers include a PZT ferroelectric layer 420, between a top electrode 422 and bottom electrode 424 in electrical contact with or electrically coupled through the LI layer 402 to one of the underlying first contacts 416. In some embodiments, such as that shown, the bottom electrode 424 includes or consists of a portion of the LI layer 402. The materials and thicknesses of the PZT ferroelectric layer 420, top electrode 422 and bottom electrode 424 can be substantially the same as those described above with respect to FIG. 2B.

Optionally, in an embodiment not shown, the ferro stack can further include a separate layer as an $O_2$ barrier formed over the LI layer 402 prior to depositing the PZT ferroelectric layer 420, or, as in the embodiment shown, the LI layer can include a material selected to form an $O_2$ barrier.

Figure 4C:
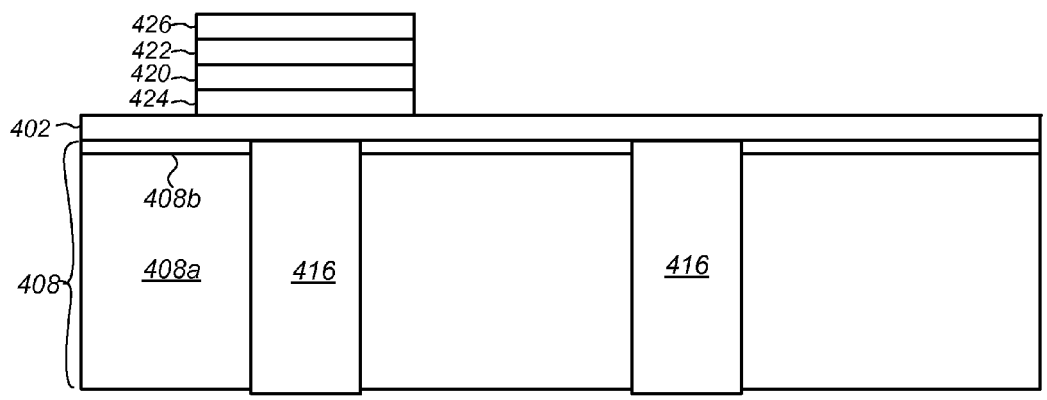

Referring to FIG. 3 and FIG. 4C a hard mask 426 is formed over the ferro stack layers using standard photolithographic and etching techniques, and the ferro stack layers etched using the hard mask to stop on the LI layer 402 (block 306).

Figure 4D:
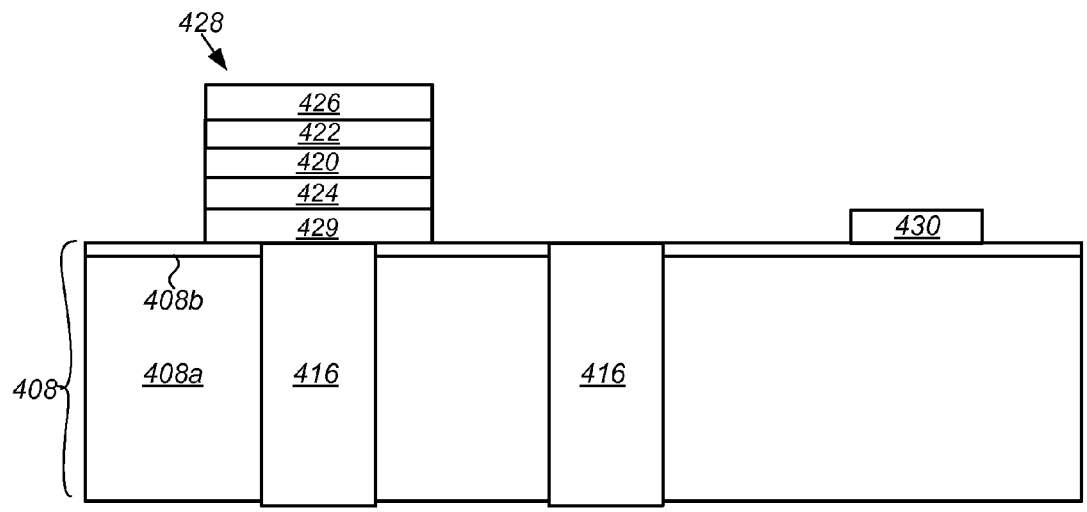

Next, referring to FIG. 3 and FIG. 4D a LI mask (not shown in this figure) is formed over LI layer 402, and the LI layer etched to form an oxygen ($O_2$) barrier 429 under the ferroelectric capacitor and a LI 430 over the first dielectric layer 408 (block 308).

Figure 4E:
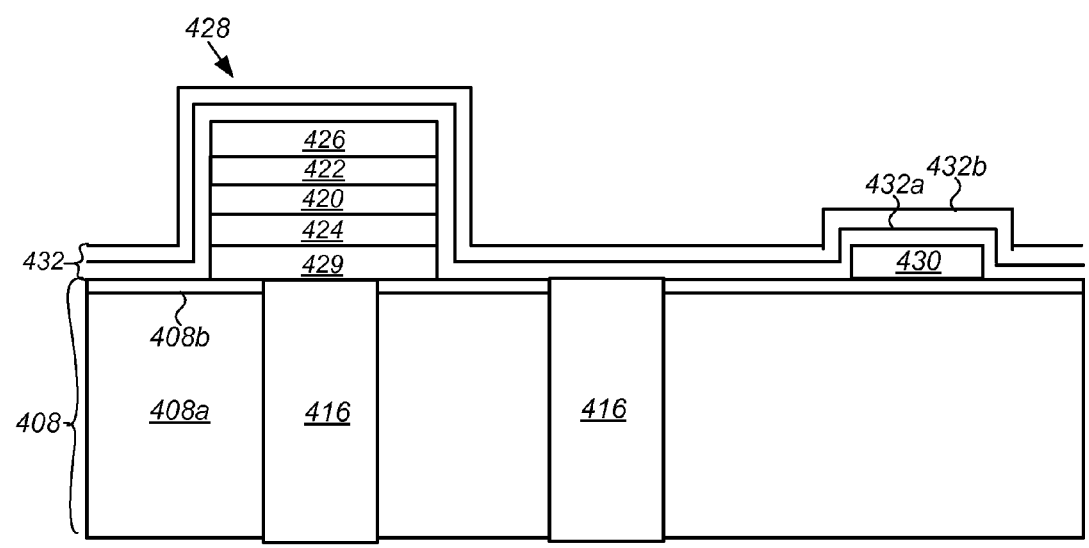

Referring to FIG. 3 and FIG. 4E a $H_2$ barrier 432 is deposited over the top and sidewalls of the ferroelectric capacitor 428, over the surface of first dielectric layer 408 and any exposed LI 430, substantially encapsulating the ferroelectric capacitor and LI (block 310). The $H_2$ barrier 432 can include a single material layer, or multiple material layers including a lower or first hydrogen encapsulation layer 432a and an upper or second hydrogen encapsulation layer 432b. The materials, thicknesses and methods of depositing the hydrogen encapsulation layers are substantially the same as those described above with respect to FIG. 2D.

Figure 4F:
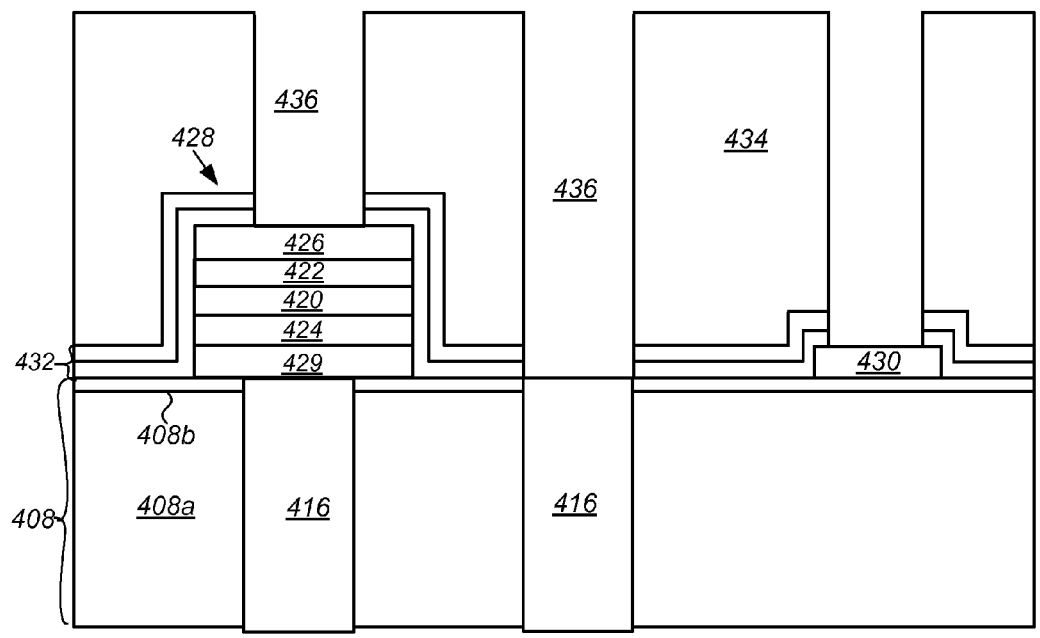

Next, referring to FIG. 3 and FIG. 4F a first ILD layer 434 is deposited or formed over the H₂ barrier 432, the first ILD layer is planarized and openings 436 for second or ferro contacts etched through the ILD layer and H₂ barrier to electrically couple to the top electrode 422 of the ferroelectric capacitor 428, to the contact 416 to the diffusion regions of the MOS transistor (not shown in this figure), and to one or more portions of the LI 430 not covered by the ferroelectric capacitor (block 312). The materials, thicknesses and methods of depositing and etching first ILD layer 434 and the H₂ barrier 432 are substantially the same as those described above with respect to FIG. 2E.

Figure 4G:
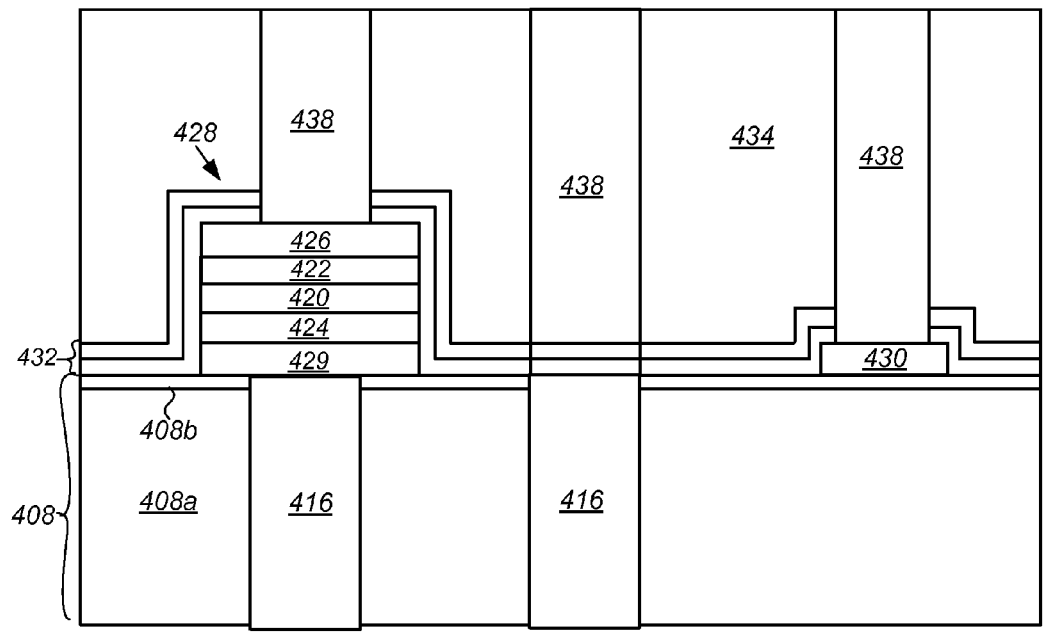

Referring to FIG. 3 and FIG. 4G, the ferro contact openings 436 are filled to form second or ferro contacts 438 (block 314). The materials of the ferro contacts 438 and methods of filling ferro contact openings 436 are substantially the same as those described above with respect to FIG. 2F.

Figure 4H:
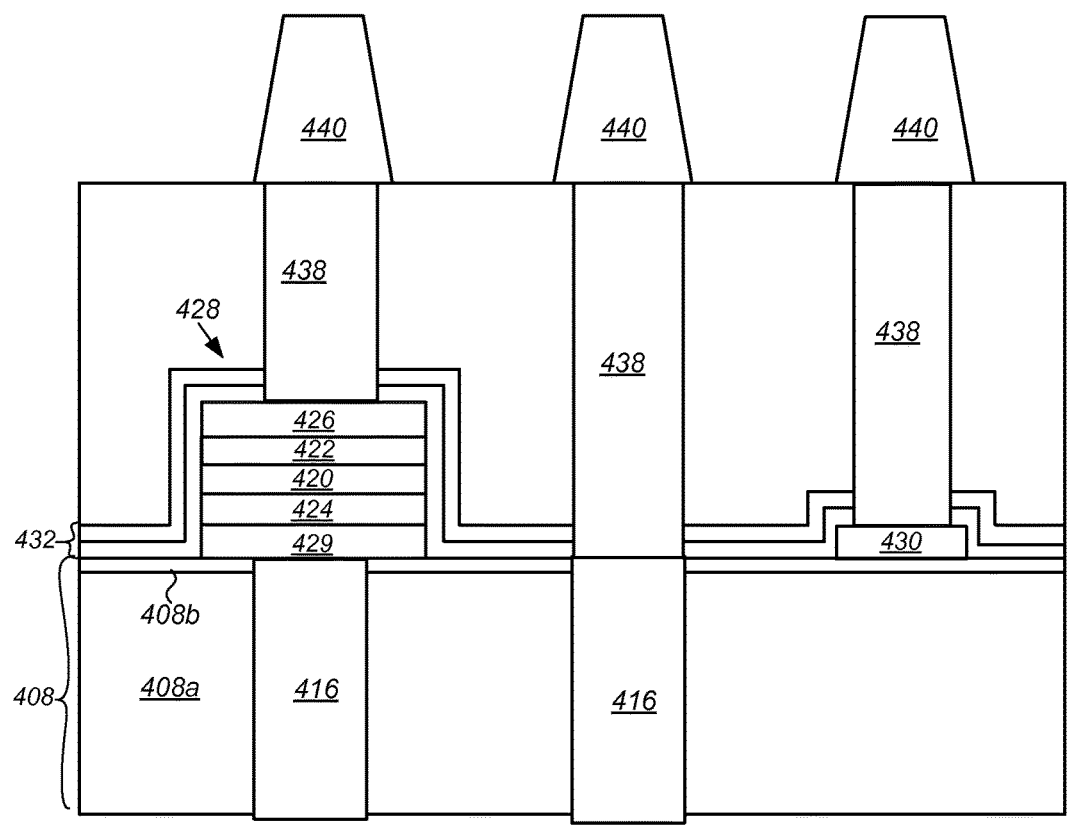

Next, referring to FIG. 3 and FIG. 4H a metal layer is deposited over the first ILD layer 434 and masked and etched to form a first metallization (M1) layer 440 (block 316). The materials, thicknesses and methods of depositing and etching first metal layer to form the M1 layer 440 are substantially the same as those described above with respect to FIG. 2I.

Figure 4I:
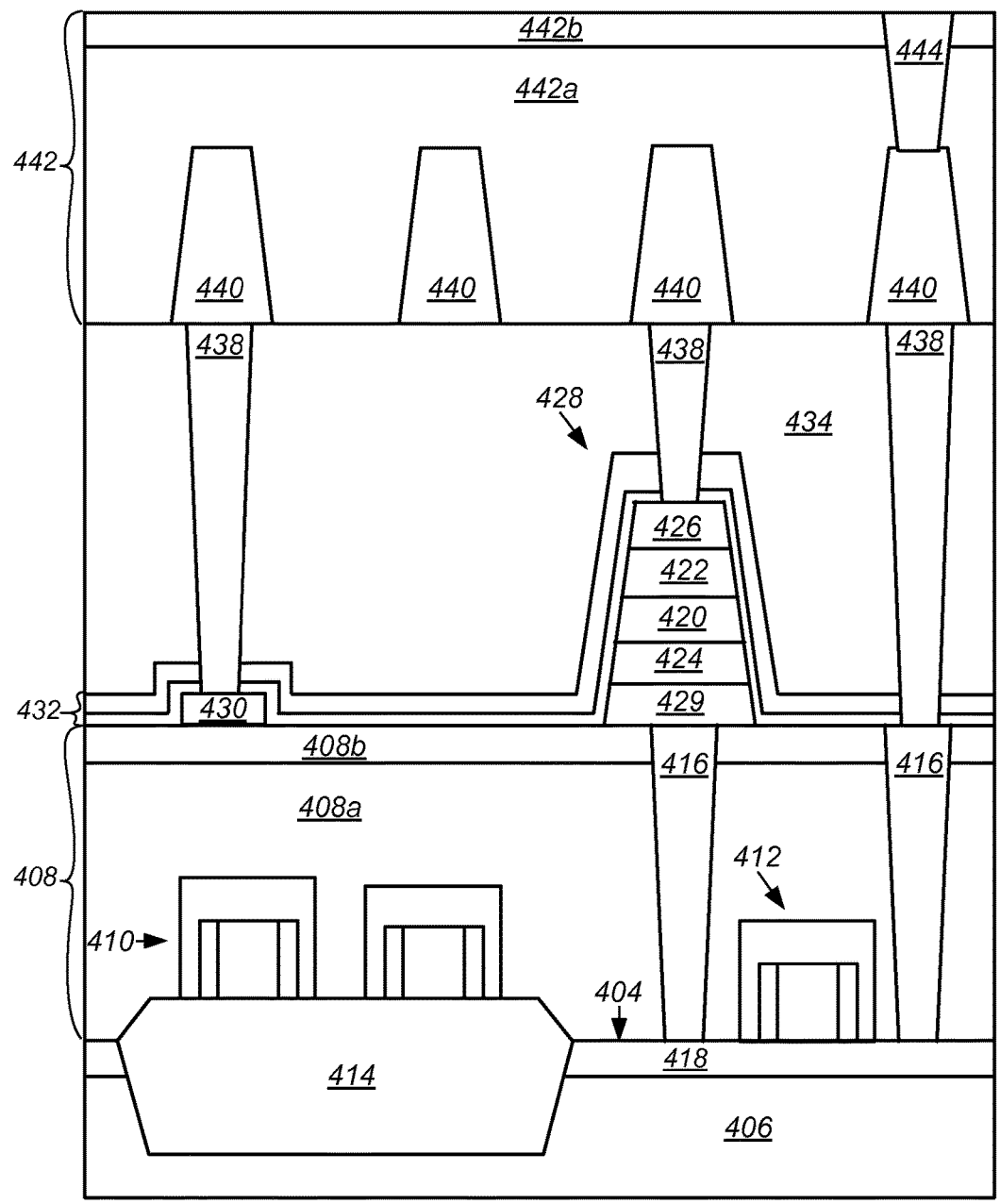
FIG. 4I is a block diagram illustrating a cross-sectional views of a portion of an F-RAM cell fabricated according to the method of FIG. 3.

A second ILD layer 442 may be deposited over M1 layer 440, masked, etched and openings formed in the second ILD layer filled to form third or M1 layer contacts 444 in a substantially complete F-RAM cell (block 318). FIG. 4I is a block diagram illustrating a cross-sectional view of a portion of a complete F-RAM cell fabricated according to the method of FIG. 3. The materials, thicknesses of the second ILD layer as well as forming the third or M1 layer contacts 444 are substantially the same as those described above with respect to FIG. 2J. In particular, it is noted that as with the second ILD layer 442 can include one or more layers, including a first or lower second ILD layer 442a including SiO₂, silicon nitride, silicon-oxynitride, or PSG, and a second or upper second ILD layer 442b including a silicon oxide, deposited by an LPCVD tool using a TEOS based process gas or precursor.

It will be understood by those skilled in the art that the method of manufacturing or fabricating an F-RAM cell including embedded or integrally formed ferroelectric capacitor and CMOS transistors described above advantageously minimizes changes to the standard complimentary metal-oxide-semiconductor (CMOS) process flow, including the addition of just a single additional mask step to form the ferroelectric capacitor and the modification of another, i.e., the LI mask referred to in connection with the step described in block 308 and FIG. 4D, thereby further reducing cost of fabricating F-RAM, and enabling tighter design rules. It will further be understood that introducing the LI 430 below the ferroelectric capacitor 428 and utilizing a portion of the LI as the bottom electrode 424 enables tighter design rules.

In still another method for fabricating an F-RAM including an embedded ferroelectric capacitor and MOS transistor, a local interconnect (LI) and LI contacts are formed using a damascene or dual-damascene process. An embodiment of this method will now be described in detail with reference to FIG. 5 and FIG. 6A through 6M.

Figure 5:
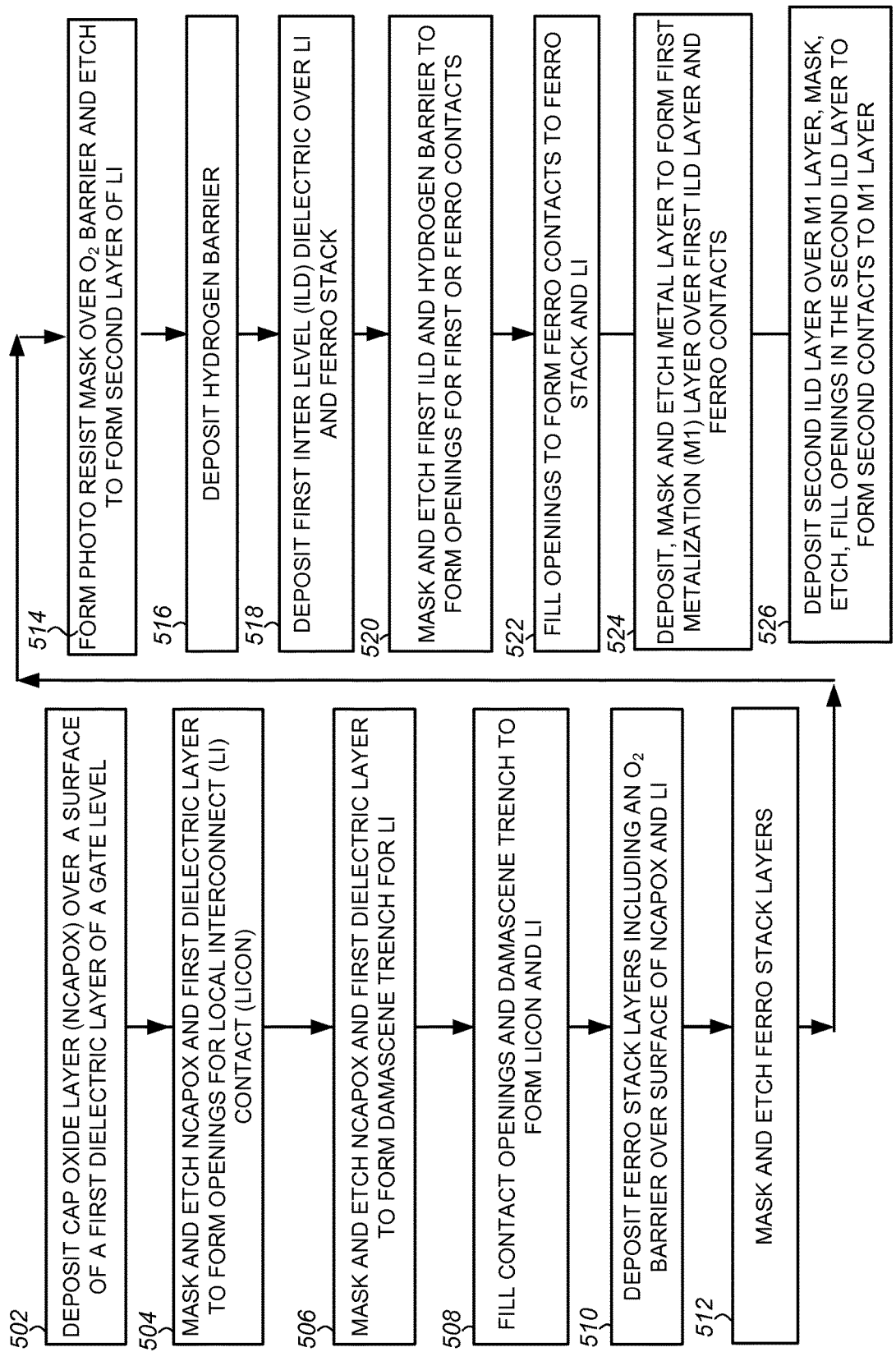
FIG. 5 is a flowchart illustrating yet another embodiment of a method for fabricating an F-RAM including an embedded ferroelectric capacitor and MOS transistor using a damascene or dual-damascene process.
Figure 6A:
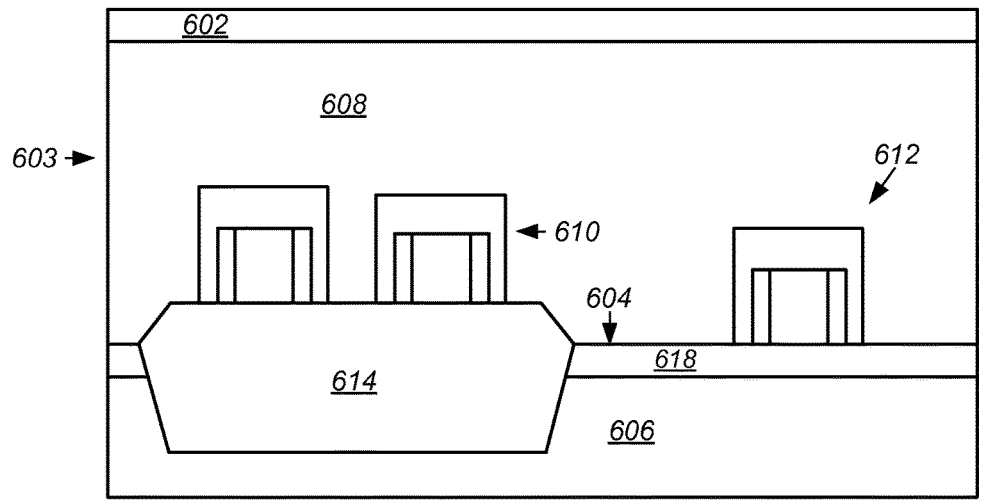
FIGS. 6A-6M are block diagrams illustrating cross-sectional views of a portion of an F-RAM during fabrication thereof according to the method of FIG. 5.

Referring to FIG. 5 and FIG. 6A, the process begins with depositing an undoped cap oxide (NCAPOX) layer 602 over a surface of a gate level 603 formed on a surface 604 of a substrate 606 (block 502). As with the embodiments of FIGS. 2A and 4A described above, the gate level 603 includes an inter-metal dielectric or first dielectric layer 608 with gate stacks 610 of one or more MOS transistors 612 separated by one or more isolation structures 614, and one or more diffusion regions 618, such as a source or a drain, of a MOS transistor.

The first dielectric layer 608 can include a single layer of dielectric material or multiple layers of dielectric material, such as PSG formed or deposited by a CVD process. The NCAPDX layer 602 can be deposited to a thickness of from about 1800 to about 2200 by CVD or ALD.

Figure 6B:
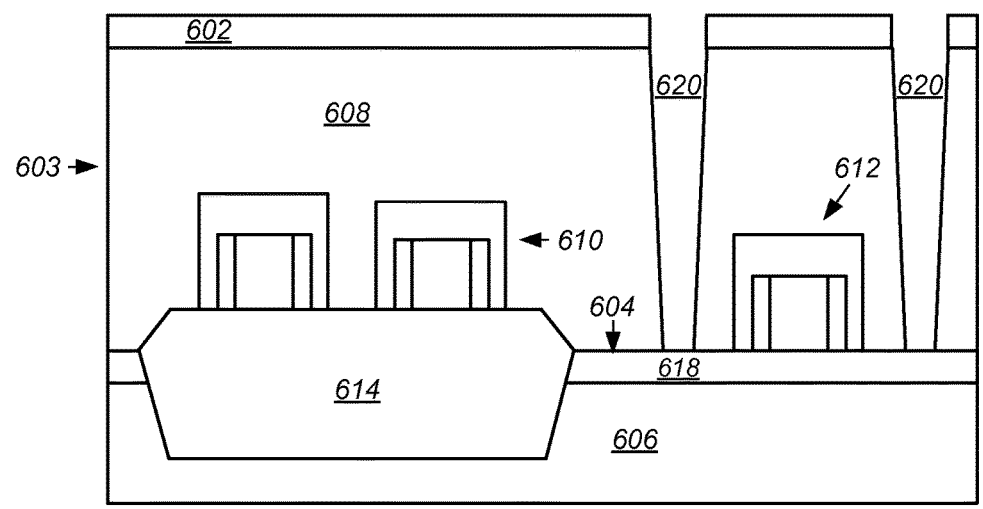

Next, referring to FIG. 5 the NCAPDX layer 602 and the first dielectric layer 608 are masked and etched to form openings for local interconnect (LI) contact (LICON) using a dual damascene process (block 504). By a dual damascene process it is meant an iterative process for forming a multilevel structure in which several processing steps including, for example, forming a first mask and etching a first opening for the LICON through the NCAPDX layer 602 and the first dielectric layer 608, followed by forming a second mask and etching a second opening, also referred to as a damascene trench, for the LI through the NCAPDX layer. Referring to FIG. 6B, an opening 620 for the LICON can be etched through the NCAPDX layer 602 and the first dielectric layer 608 using standard photolithographic techniques and any suitable wet or dry etching chemistry for etching a silicon oxide and/or PSG, as described above with respect to FIGS. 1 and 2A.

Figure 6C:
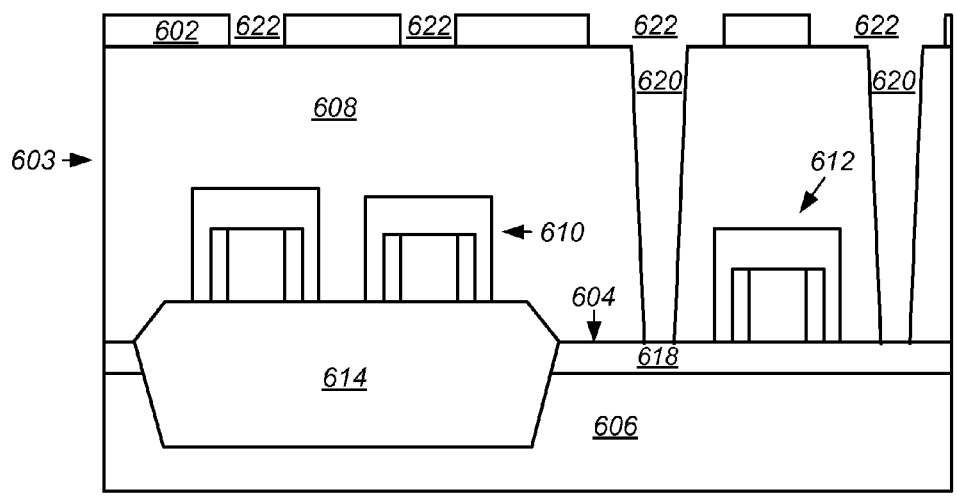

Referring to FIG. 6C, a second patterned mask, with a larger opening is then formed and a second etch selective to the material of the NCAPDX layer 602 is then performed to etch second openings or damascene trenches 622 for the LI through the NCAPDX layer (block 506).

Figure 6D:
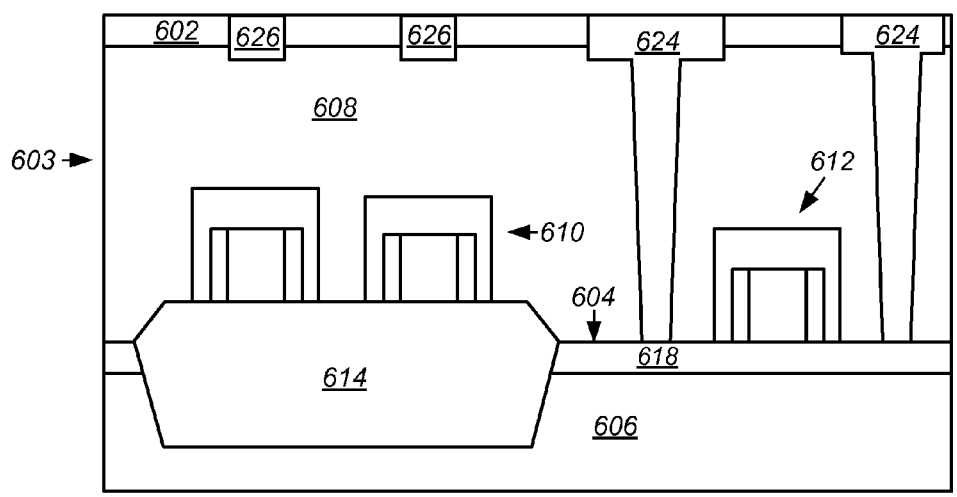

Referring to FIG. 5 and FIG. 6D openings 620 for the LICON and damascene trenches 622 are filled to form a number of first or LICON 624 and the LI 626 (block 508). It will be understood that while upper portions of the LICON 624 are formed from the same material as LI 626 and may have the same dimensions as portions of the LI, these upper portions of the LICON are not physically or electrically coupled to the LI and do not function as a part of the LI. Rather these LICON 624 underlie a subsequently formed ferroelectric capacitor and couple the ferroelectric capacitor to diffusion regions 618 of the MOS transistor 612. As with the first contacts described above with respect to FIG. 2A, the LICON 624 and the LI 626 can be formed by filling the openings 620 for the LICON and damascene trenches 622 with a refractory metal, such as titanium (Ti), tantalum (Ta), tungsten (W), and nitrides or alloys thereof, by physical vapor deposition, such as sputtering or evaporation, or by CVD or electroless plating. In one embodiment, the LICON 624 and the LI 626 are formed by filling the openings 620 for the LICON and damascene trenches 622 with tungsten using a CVD process.

Figure 6E:
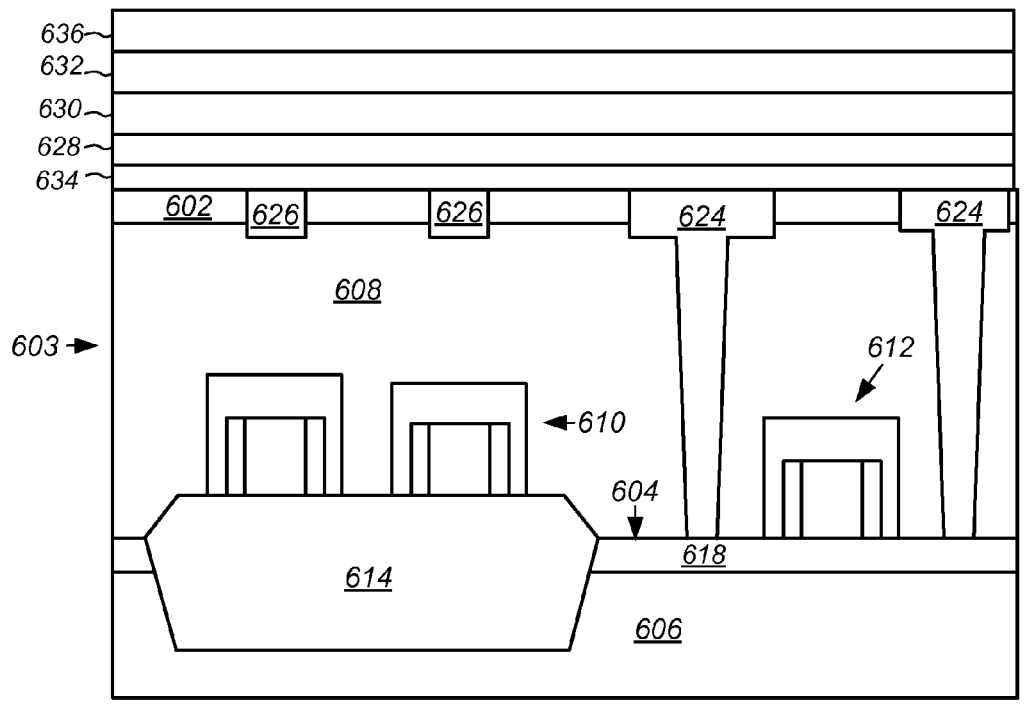

Next, referring to FIG. 5 and FIG. 6E ferro stack layers are deposited or formed over the surface of the first dielectric layer 608 and the LI 626 (block 510). The ferro stack layers include a bottom electrode 628 in electrical contact with or electrically coupled through the LI 626 and one of the underlying LICON 624 to a diffusion region 618 of the MOS transistor 612, a PZT ferroelectric layer 630 formed on the bottom electrode, and a single-layer or a multi-layer top electrode 632 formed on the PZT ferroelectric layer. The ferro stack can further include an O₂ barrier 634 formed or deposited prior to depositing bottom electrode 628. The O₂ barrier 634 is a separate layer of material formed over or on top of the LI 626. The material of the LI 626 is tungsten (W) and generally can have dimensions or a thickness substantially the same as those described above with respect to FIG. 4B. The materials and thicknesses of the bottom electrode 628, the PZT ferroelectric layer 630, the top electrode 632, and the $O_2$ barrier 634 can be substantially the same as those described above with respect to FIG. 4B.

Figure 6F:
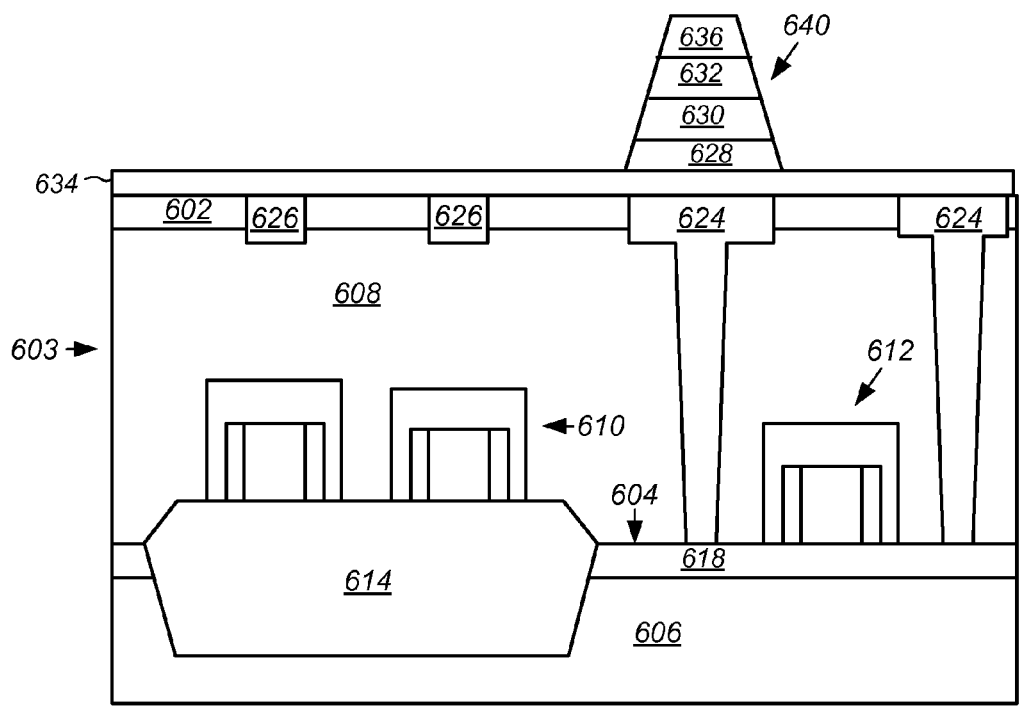

Referring to FIG. 5 and FIG. 6F a hard mask 636 is formed over the ferro stack layers, and the ferro stack layers etched using a hard mask and standard etching techniques, such as those described above with respect to FIG. 4C, to stop on the $O_2$ barrier 634 (block 512).

Figure 6G:
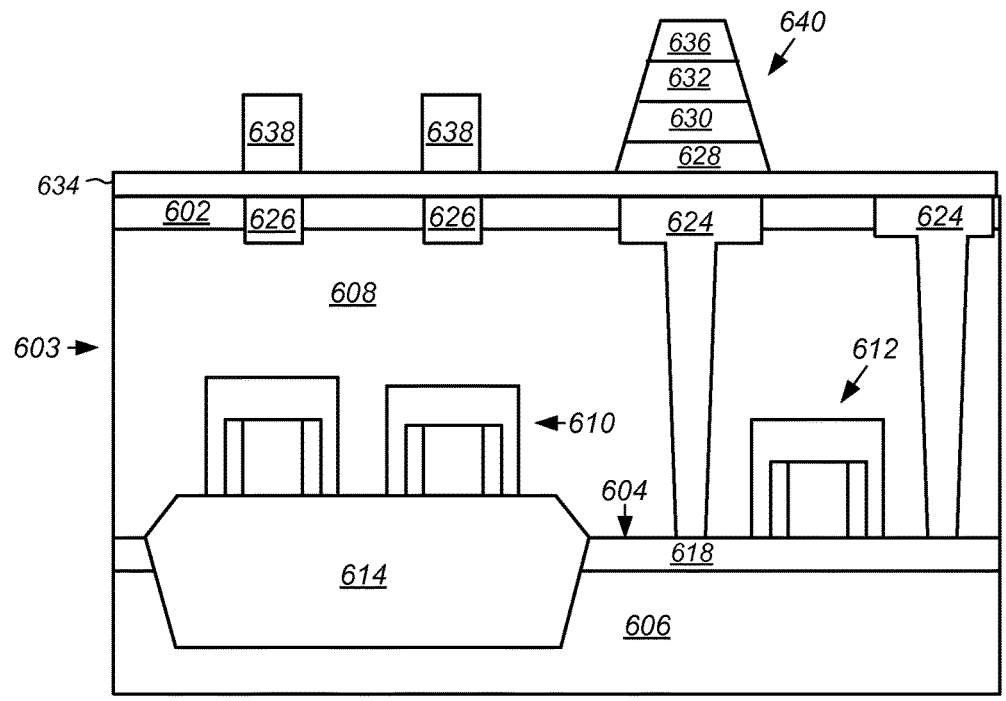
Figure 6H:
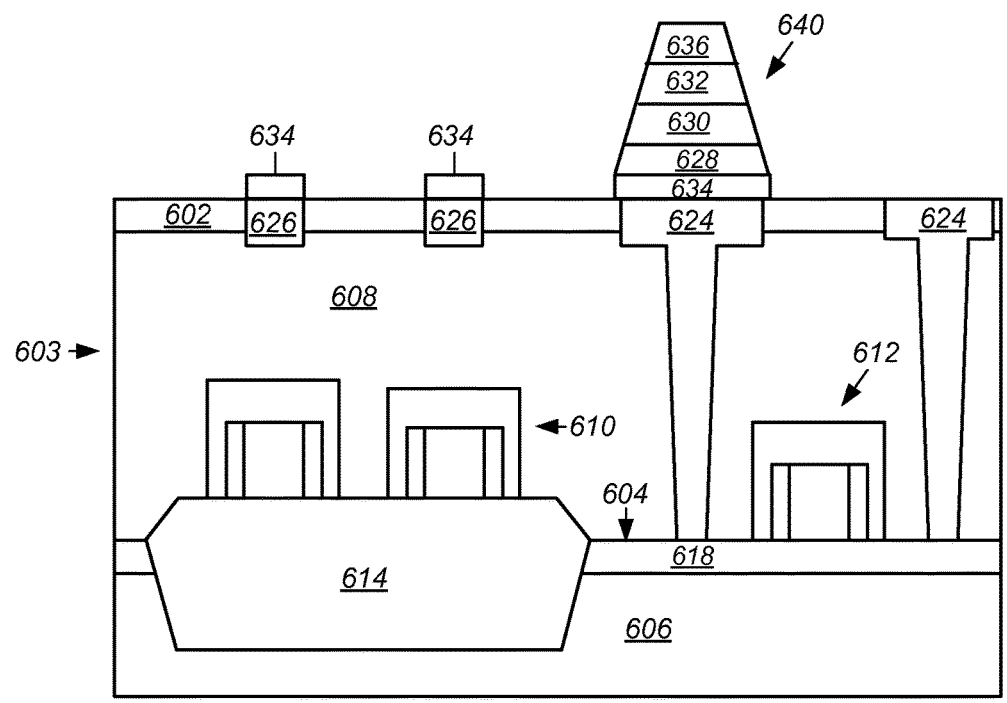

Next, referring to FIG. 5 and FIG. 6G a photoresist mask 638 is formed over the $O_2$ barrier 634, and the $O_2$ barrier etched to form a ferroelectric capacitor 640 and LI 626 including the $O_2$ barrier formed thereon as shown in FIG. 6H (block 514).

Figure 6I:
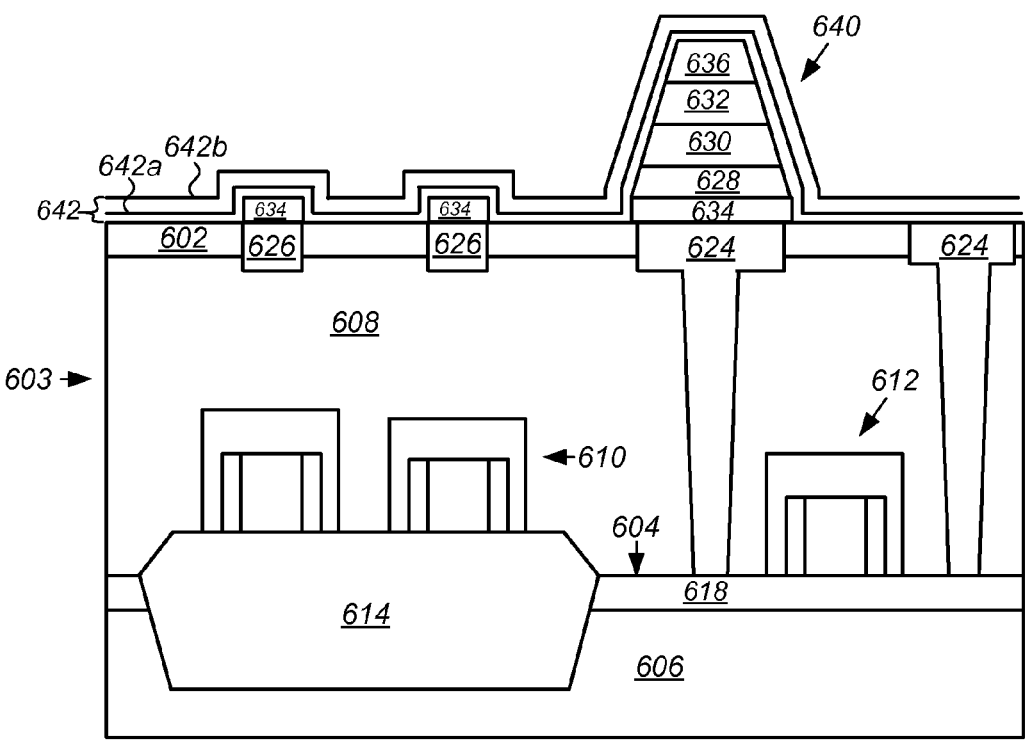

Referring to FIG. 5 and FIG. 6I, a $H_2$ barrier 642 is deposited over the top and sidewalls of the ferroelectric capacitor 640, over the surface of first dielectric layer 608 and the $O_2$ barrier formed on the LI 626, substantially encapsulating the ferroelectric capacitor and the LI (block 516). The $H_2$ barrier 642 can include a single material layer, or multiple material layers including a lower or first hydrogen encapsulation layer 642a and an upper or second hydrogen encapsulation layer 642b. The materials, thicknesses and methods of depositing the hydrogen encapsulation layers are substantially the same as those described above with respect to FIGS. 2D and 4E.

Figure 6J:
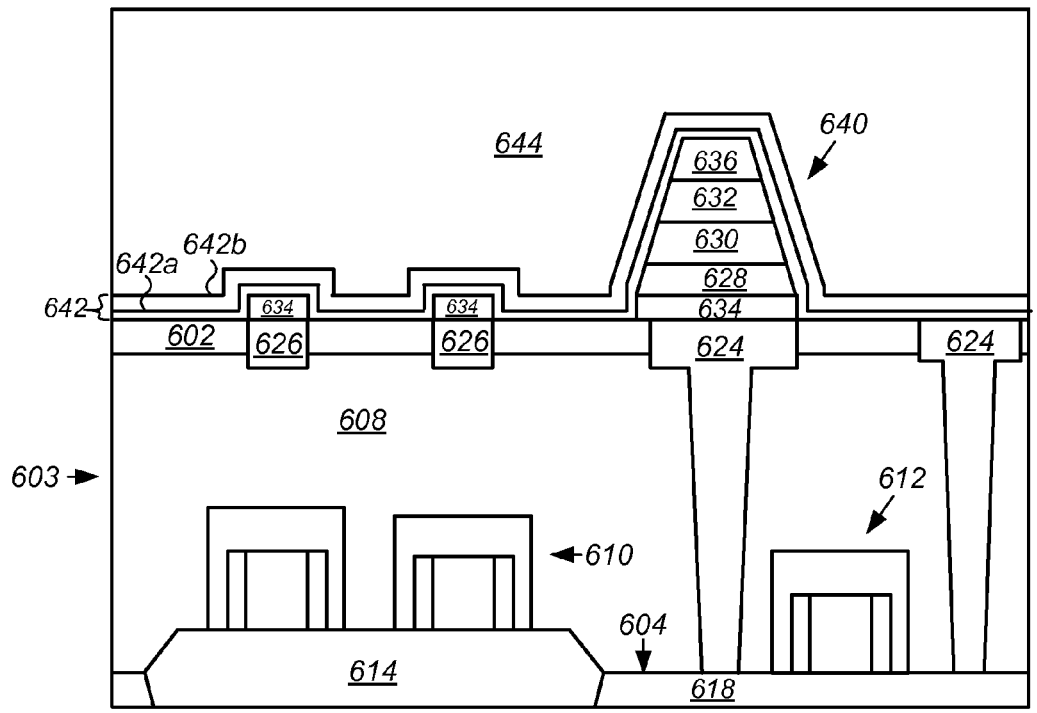

Next, referring to FIG. 5 and FIG. 6J a first ILD layer 644 is deposited or formed over the $H_2$ barrier 642 (block 518). The materials, thicknesses and methods of depositing and etching first ILD layer 644 and the $H_2$ barrier 642 are substantially the same as those described above with respect to FIGS. 2E and 4F.

Figure 6K:
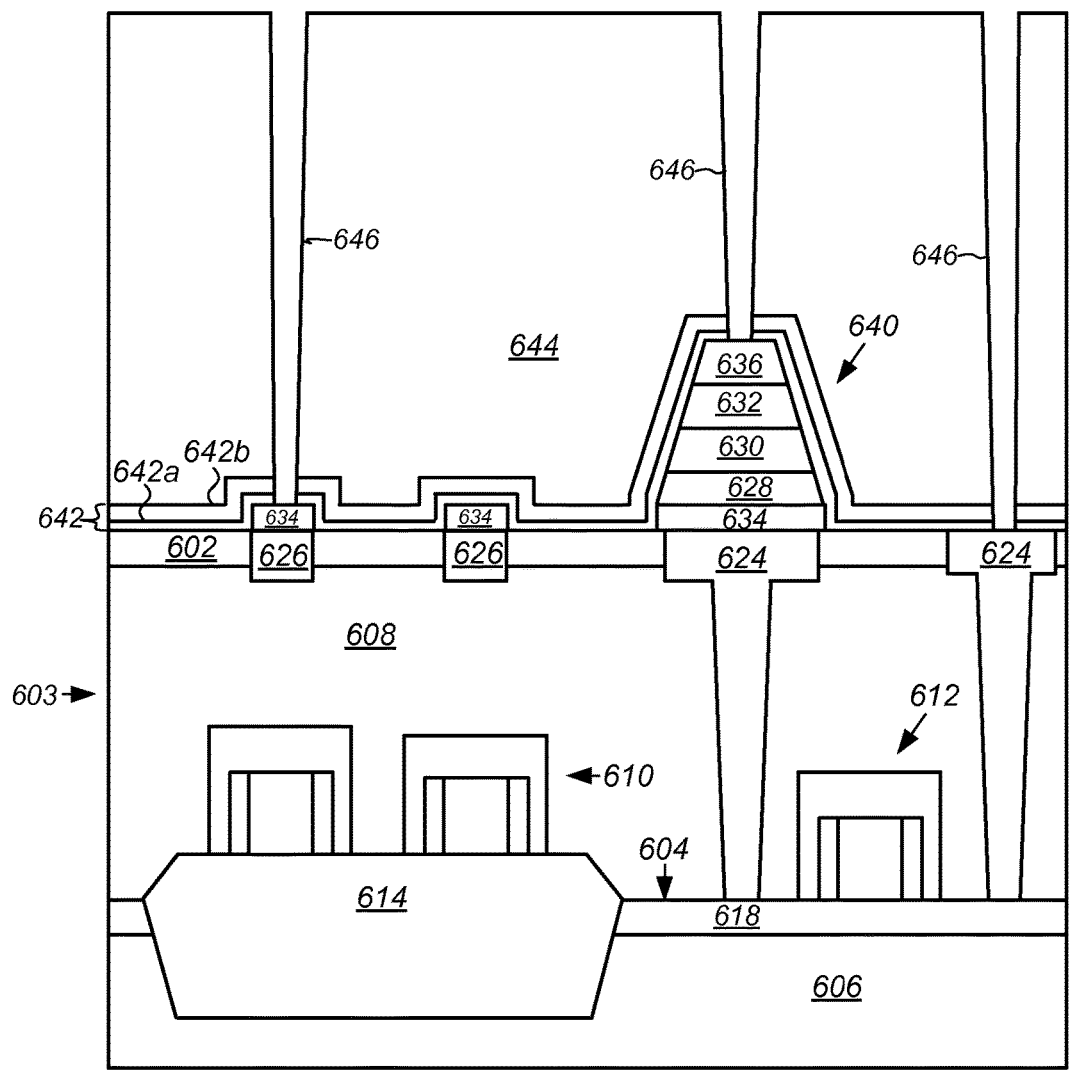

Referring to FIG. 5 and FIG. 6K the first ILD layer 644 is planarized and openings 646 for second or ferro contacts etched through the first ILD layer and $H_2$ barrier to electrically couple to the top electrode 632 of the ferroelectric capacitor 640, and to one or more portions of the LI 626 not covered by the ferroelectric capacitor (block 520). The methods of etching first ILD layer 644 and the $H_2$ barrier 642 are substantially the same as those described above with respect to FIGS. 2E and 4F.

Figure 6L:
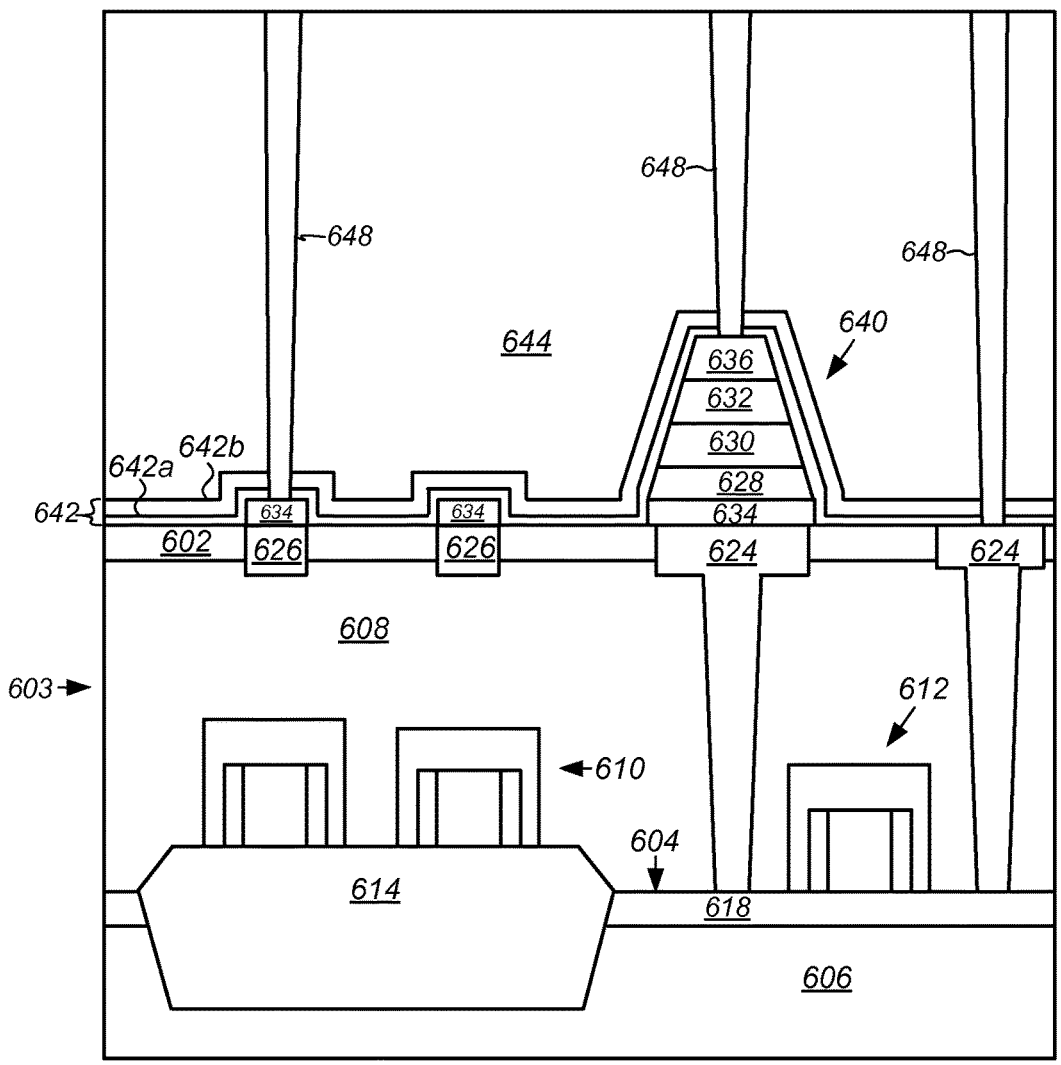

Next, referring to FIG. 5 and FIG. 6L, the ferro contact openings 646 are filled to form second or ferro contacts 648 (block 520). The materials of the ferro contacts 648 and methods of filling ferro contact openings 646 are substantially the same as those described above with respect to FIGS. 2F and 4G.

Figure 6M:
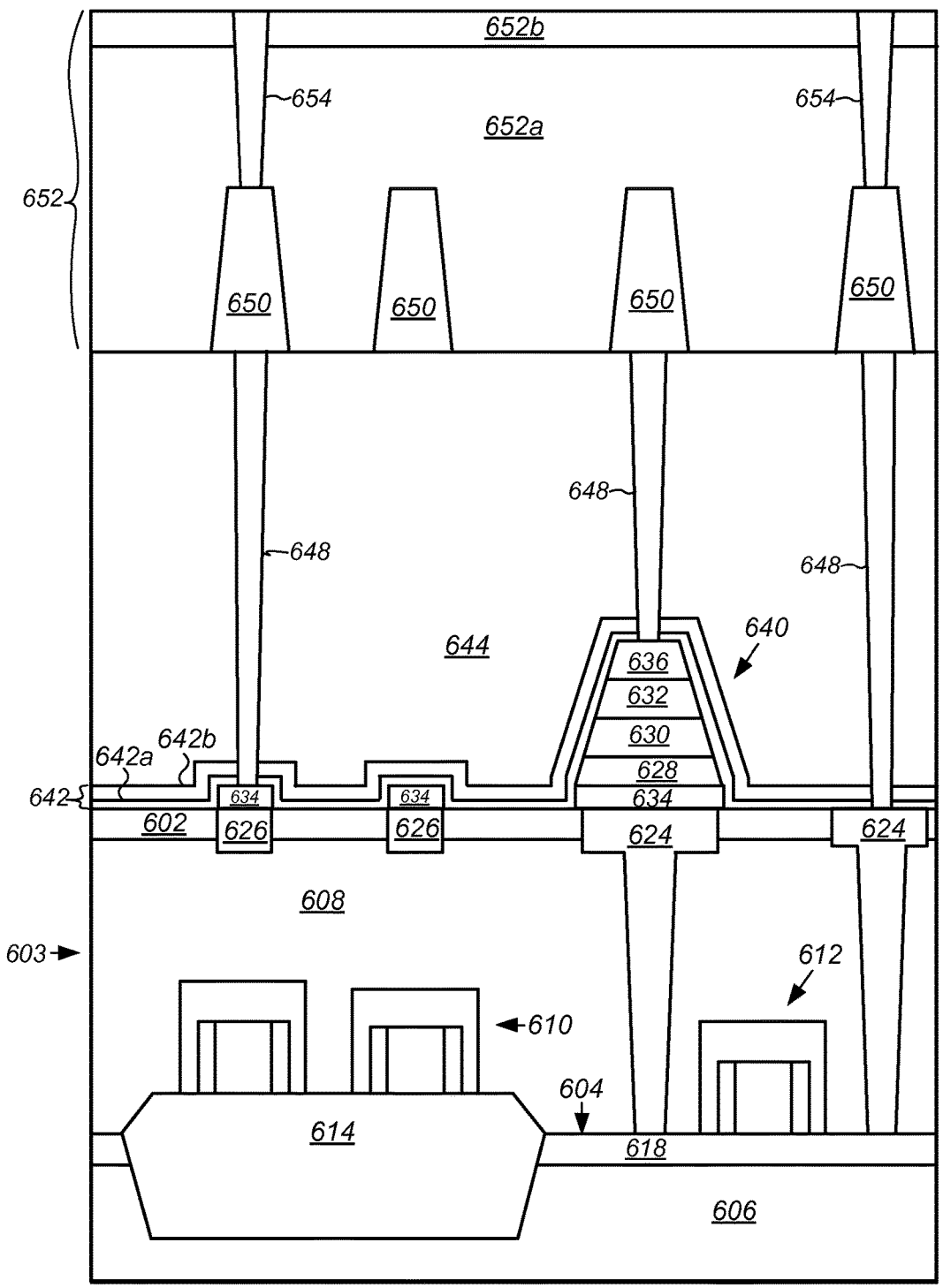

Next, referring to FIG. 5 and FIG. 6M a metal layer is deposited over the first ILD layer 644 and masked and etched to form a first metallization (M1) layer 650 (block 522). The materials, thicknesses and methods of depositing and etching first metal layer to form the M1 layer 650 are substantially the same as those described above with respect to FIGS. 2I and 4H.

A second ILD layer 652 can be deposited over M1 layer 650, masked, etched and openings formed in the second ILD layer filled to form third or M1 layer contacts 654 in a substantially complete F-RAM cell (block 524). FIG. 6M is a block diagram illustrating a cross-sectional view of a portion of a complete F-RAM cell fabricated according to the method of FIG. 5. The materials, thicknesses of the second ILD layer as well as forming the third or M1 layer contacts 654 are substantially the same as those described above with respect to FIGS. 2J and 4I. In particular, it is noted that as with the second ILD layer 652 can include one or more layers, including a first or lower second ILD layer 652a including $SiO_2$, silicon nitride, silicon-oxynitride, or PSG, and a second or upper second ILD layer 652b including a silicon oxide, deposited by an LPCVD tool using a TEOS based process gas or precursor.

It will be understood by those skilled in the art that the method of manufacturing or fabricating an F-RAM cell including embedded or integrally formed ferroelectric capacitor and CMOS transistors using the dual damascene process described above advantageously minimizes changes to the standard CMOS process flow, thereby further reducing cost of fabricating F-RAM and enabling tighter design rules. It will further be understood that introducing the LI 626 below the surface of the NCAPDX layer 602 enables tighter design rules.

Figure 7:
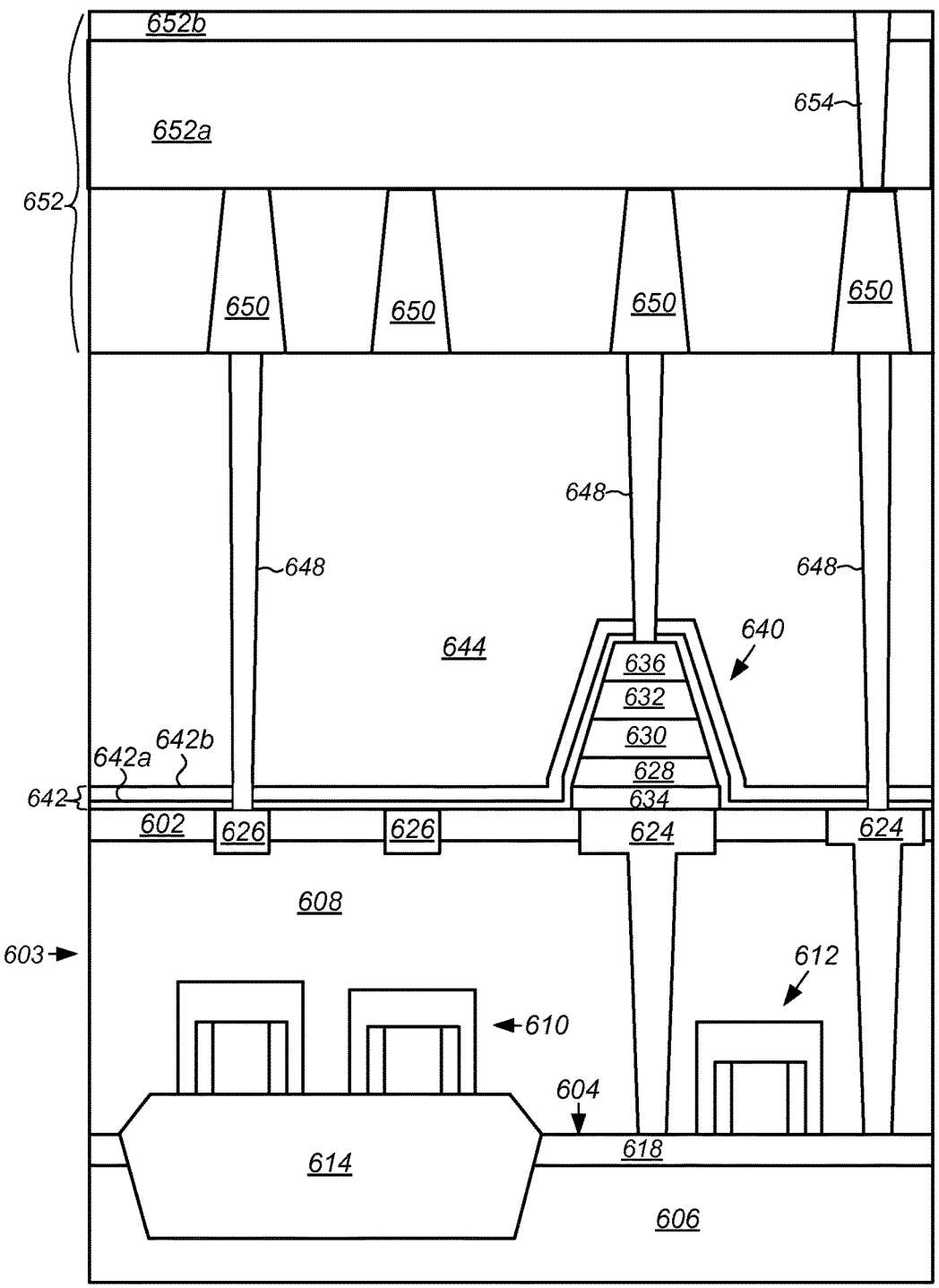
FIG. 7 is a block diagram illustrating a cross-sectional view of a portion of a completed F-RAM fabricated according to an alternate embodiment of the method of FIG. 5.

FIG. 7 is a block diagram illustrating a cross-sectional view of a portion of a completed F-RAM fabricated according to an alternate embodiment of the method of FIG. 5. Referring to FIG. 7, in this embodiment the forming of a photoresist mask is over the $O_2$ barrier 634 described with respect to the step of block 514 and FIG. 6G, is omitted and the $O_2$ barrier etched or removed from the LI 626 prior to the step of forming the $H_2$ barrier 642.

Thus, embodiments of ferroelectric random access memories including embedded or integrally formed F-RAM capacitors and CMOS transistors and methods of fabricating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:
1. A method comprising:
  forming a gate level on a surface of a substrate, the gate level including a gate stack of a metal-oxide-semiconductor (MOS) transistor, a first dielectric layer overlying the MOS transistor and a first contact extending through the first dielectric layer from a top surface thereof to a diffusion region of the MOS transistor in the substrate;

depositing a local interconnect (LI) layer over the top surface of the first dielectric layer and the first contact, the LI layer comprising aluminum titanium nitride (AlTiN);

depositing an iridium layer on the LI layer;

depositing directly on the iridium layer a ferroelectric layer and a top electrode layer;

patterning the top electrode layer, the ferroelectric layer and the iridium layer, stopping on the LI layer to form a ferro stack;

patterning the LI layer to concurrently form a ferroelectric capacitor comprising the ferro stack and a bottom electrode comprising the patterned iridium layer and a portion of the LI layer through which the bottom electrode is electrically coupled to the diffusion region of the MOS transistor, and a LI comprising an exposed portion of the LI layer not covered by the ferro stack; and concurrently encapsulating the ferroelectric capacitor and the LI with an encapsulation layer, wherein encapsulating the LI comprises depositing the encapsulation layer directly on a top surface and sidewalls of LI.

2. The method of claim 1, wherein the encapsulation layer comprises multiple layers including a hydrogen ($H_2$) barrier comprising aluminum oxide ($Al_2O_3$) deposited over the ferroelectric capacitor and the LI.

3. The method of claim 2, wherein the encapsulation layer further comprises a nitride layer comprising silicon nitride over the $H_2$ barrier.

4. The method of claim 1, further comprising planarizing the first dielectric layer using a chemical mechanical planarization (CMP) process prior to depositing the LI layer.

5. The method of claim 1, wherein depositing the top electrode layer comprises depositing a layer comprising iridium on the ferroelectric layer.

6. The method of claim 1, wherein depositing the top electrode layer comprises depositing a lower layer of iridium oxide in contact with the ferroelectric layer and an upper layer of iridium (Ir) overlying the lower layer of the top electrode.

7. The method of claim 1, wherein the first dielectric layer comprises a bottom first dielectric layer and a top first dielectric layer comprising silicon oxide, and wherein planarizing the first dielectric layer comprises planarizing the top first dielectric layer using a chemical mechanical planarization (CMP) process.

8. A method comprising:

forming a gate level on a surface of a substrate, the gate level including a gate stack of a transistor, a first dielectric layer overlying the transistor and a first contact extending through the first dielectric layer from a top surface thereof to a diffusion region of the transistor in the substrate;

depositing a local interconnect (LI) layer on the top surface of the first dielectric layer and the first contact, the LI layer comprising titanium aluminum nitride (TiAlN);

depositing an iridium layer on the LI layer;

depositing a ferroelectric layer directly on the iridium layer, and a top electrode layer on the ferroelectric layer; and patterning the top electrode layer, ferroelectric layer and the iridium layer to stop on the LI layer, patterning the LI layer to concurrently form in a first region of the substrate a ferroelectric capacitor including a top electrode, a ferroelectric, and a bottom electrode comprising the patterned iridium layer and a portion of the LI layer and in a second region of the substrate a LI comprising an exposed portion of the LI layer not covered by the top electrode layer, the ferroelectric layer or the iridium layer.

9. The method of claim 8, further comprising encapsulating the ferroelectric capacitor and the LI with an encapsulation layer.

10. The method of claim 9, wherein the encapsulation layer comprises multiple layers including a hydrogen ($H_2$) barrier comprising aluminum oxide ($Al_2O_3$) deposited over the ferroelectric capacitor and the LI.

11. The method of claim 10, wherein the encapsulation layer further comprises a nitride layer comprising silicon nitride over the $H_2$ barrier.

12. The method of claim 8, further comprising planarizing the first dielectric layer using a chemical mechanical planarization (CMP) process prior to depositing the LI layer.

13. The method of claim 8, wherein depositing the top electrode layer comprises depositing a layer comprising iridium on the ferroelectric layer.

14. The method of claim 8, wherein depositing the top electrode layer comprises depositing a lower layer of iridium oxide in contact with the ferroelectric layer and an upper layer of iridium (Ir) overlying the lower layer of the top electrode.

* * * * *